(12) United States Patent
Allegato et al.

(10) Patent No.: US 8,988,155 B2
(45) Date of Patent: Mar. 24, 2015

(54) OSCILLATOR DEVICE AND MANUFACTURING PROCESS OF THE SAME

(71) Applicant: STMicroelectronics S.r.l., Agrate Brianza (IT)

(72) Inventors: Giorgio Allegato, Monza (IT); Paolo Ferrari, Gallarate (IT); Laura Maria Castoldi, Abbiategrasso (IT); Benedetto Vigna, Potenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/689,430

(22) Filed: Nov. 29, 2012

(65) Prior Publication Data

US 2013/0135056 A1 May 30, 2013

(30) Foreign Application Priority Data

Nov. 30, 2011 (IT) .............. TO2011A1100

(51) Int. Cl.
*H03B 5/32* (2006.01)
*H01L 41/053* (2006.01)
(Continued)

(52) U.S. Cl.
CPC ............ *H03B 1/00* (2013.01); *H01L 29/66007* (2013.01); *H01L 41/29* (2013.01);
(Continued)

(58) Field of Classification Search
CPC .... H03B 5/30; H03B 5/32; H03B 2200/0016; H03B 2200/0018; H03L 1/028; H03H 3/02; H03H 3/04; H03H 9/05; H03H 9/0538; H03H 9/0542; H03H 9/10; H03H 9/1021; H03H 9/125; H03H 9/13; H03H 9/17; H03H 9/172; H03H 9/19; H03H 9/21; H03H 9/215
USPC ......... 310/311, 315, 341, 344, 348, 361, 370; 331/68, 69, 154, 156, 158
See application file for complete search history.

(56) References Cited

U.S. PATENT DOCUMENTS 4,191,905 A * 3/1980 Yasuda et al. .................. 310/344
5,041,800 A * 8/1991 Long et al. ....................... 331/69
(Continued)

OTHER PUBLICATIONS

De Los Santos, H. J. et al., "RF MEMS for Ubiquitous Wireless Connectivity: Part 1—Fabrication," IEEE Microwave Magazine, vol. 5, No. 4, pp. 36-49, Dec. 1, 2004.
(Continued)

*Primary Examiner* — Levi Gannon
(74) *Attorney, Agent, or Firm* — Seed IP Law Group PLLC

(57) ABSTRACT

An oscillator device includes: a structural layer extending over a first side of a semiconductor substrate; a semiconductor cap set on the structural layer; a coupling region extending between and hermetically sealing the structural layer and the cap and forming a cavity within the oscillator device; first and second conductive paths extending between the substrate and the structural layer; first and second conductive pads housed in the cavity and electrically coupled to first terminal portions of the first and second conductive paths by first and second connection regions, respectively, which extend through and are insulated from the structural layer; a piezoelectric resonator having first and second ends electrically coupled, respectively, to the first and second conductive pads, and extending in the cavity; and third and fourth conductive pads positioned outside the cavity and electrically coupled to second terminal portions of the first and second conductive paths.

26 Claims, 17 Drawing Sheets

(51) Int. Cl.
  *H01L 41/083* (2006.01)
  *H01L 41/23* (2013.01)
  *H03B 1/00* (2006.01)
  *H01L 29/66* (2006.01)
  *H01L 41/29* (2013.01)
  *H03H 3/02* (2006.01)
  *H03H 9/05* (2006.01)
  *H03H 9/10* (2006.01)
  *H01L 41/09* (2006.01)
  *H03H 9/17* (2006.01)
  *H03H 3/007* (2006.01)

(52) U.S. Cl.
  CPC .............. *H03H 3/02* (2013.01); *H01L 41/053* (2013.01); *H03B 5/32* (2013.01); *H01L 41/083* (2013.01); *H01L 41/23* (2013.01); *H03H 9/0538* (2013.01); *H03H 9/10* (2013.01); *H01L 41/094* (2013.01); *H03H 9/172* (2013.01); *H03H 3/007* (2013.01); *H03H 9/1007* (2013.01); *H03H 9/1057* (2013.01)
  USPC .............. 331/68; 331/154; 310/344; 310/348

(56) References Cited

U.S. PATENT DOCUMENTS

| | | | | |
|---|---|---|---|---|
| 5,917,272 | A * | 6/1999 | Clark et al. | 310/343 |
| 5,952,894 | A * | 9/1999 | Fukiharu | 331/176 |
| 6,531,807 | B2 * | 3/2003 | Tanaka et al. | 310/344 |
| 6,930,569 | B2 * | 8/2005 | Hsu | 333/186 |
| 7,239,211 | B2 * | 7/2007 | Tanaka | 331/176 |
| 7,282,388 | B2 * | 10/2007 | Kwon | 438/106 |
| 7,489,208 | B2 * | 2/2009 | Moriya | 331/158 |
| 7,760,034 | B2 * | 7/2010 | Moriya | 331/68 |
| 8,031,013 | B2 * | 10/2011 | Takeuchi et al. | 331/68 |
| 8,232,845 | B2 * | 7/2012 | Ruby et al. | 331/68 |
| 8,466,606 | B2 * | 6/2013 | Chen et al. | 310/348 |
| 2009/0195323 | A1 * | 8/2009 | Harima | 331/68 |
| 2011/0221303 | A1 * | 9/2011 | Chiba | 310/313 R |
| 2012/0074818 | A1 * | 3/2012 | Crowley et al. | 310/348 |

OTHER PUBLICATIONS

Lau, J. H. et al., "Advanced MEMS Packaging," McGraw Hill, New York, US, Jan. 1, 2010, pp. 6, 68-72, 172-174, 344-347, 438-442, 464-467, and 516-522.

* cited by examiner

OSCILLATOR DEVICE AND MANUFACTURING PROCESS OF THE SAME

BACKGROUND

1. Technical Field

The present disclosure relates to an oscillator device and to a process for manufacturing the same, and in particular to a package made of semiconductor material that houses a resonator.

2. Description of the Related Art

Crystal oscillators are electronic circuits that exploit the mechanical resonance of a vibrating piezoelectric crystal to create an electrical signal characterized by a very precise frequency. The main applications of crystal oscillators regard digital integrated circuits, such as generators of a stable reference clock signal, and stabilization of the operating frequency of radio transmitters, receivers, watches, etc.

Crystal oscillators are typically housed in a hermetic package, such as to guarantee a constant value of ambient pressure inside it for the entire service life of the crystal oscillator. The package has moreover the function of protection of the crystal from conditions that are adverse for its operation (humidity, material damage, etc.).

Packages normally used for crystal oscillators are of a ceramic or metal type, and are such as to guarantee a good isolation of the internal cavity with respect to the environment external to the package and at the time same possess good characteristics of protection.

However, these packages have relatively large dimensions, a heavy weight, and high manufacturing costs.

BRIEF SUMMARY

One embodiment of the present disclosure is an oscillator device and a process for manufacturing the same that will be able to overcome the drawbacks of the known art. In particular, the oscillator device according to one embodiment of the present disclosure comprises a package having good characteristics of isolation of the internal cavity with respect to the environment external to the package (hermetic package), good characteristics of protection of the resonator housed therein, low manufacturing costs, reduced weight, and small overall dimensions.

According to the present disclosure, an oscillator device and a process for manufacturing the same are provided as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

The present disclosure regards an oscillator device, comprising an encapsulating structure (or package) and a resonator housed in a cavity within the package.

Figure 14:
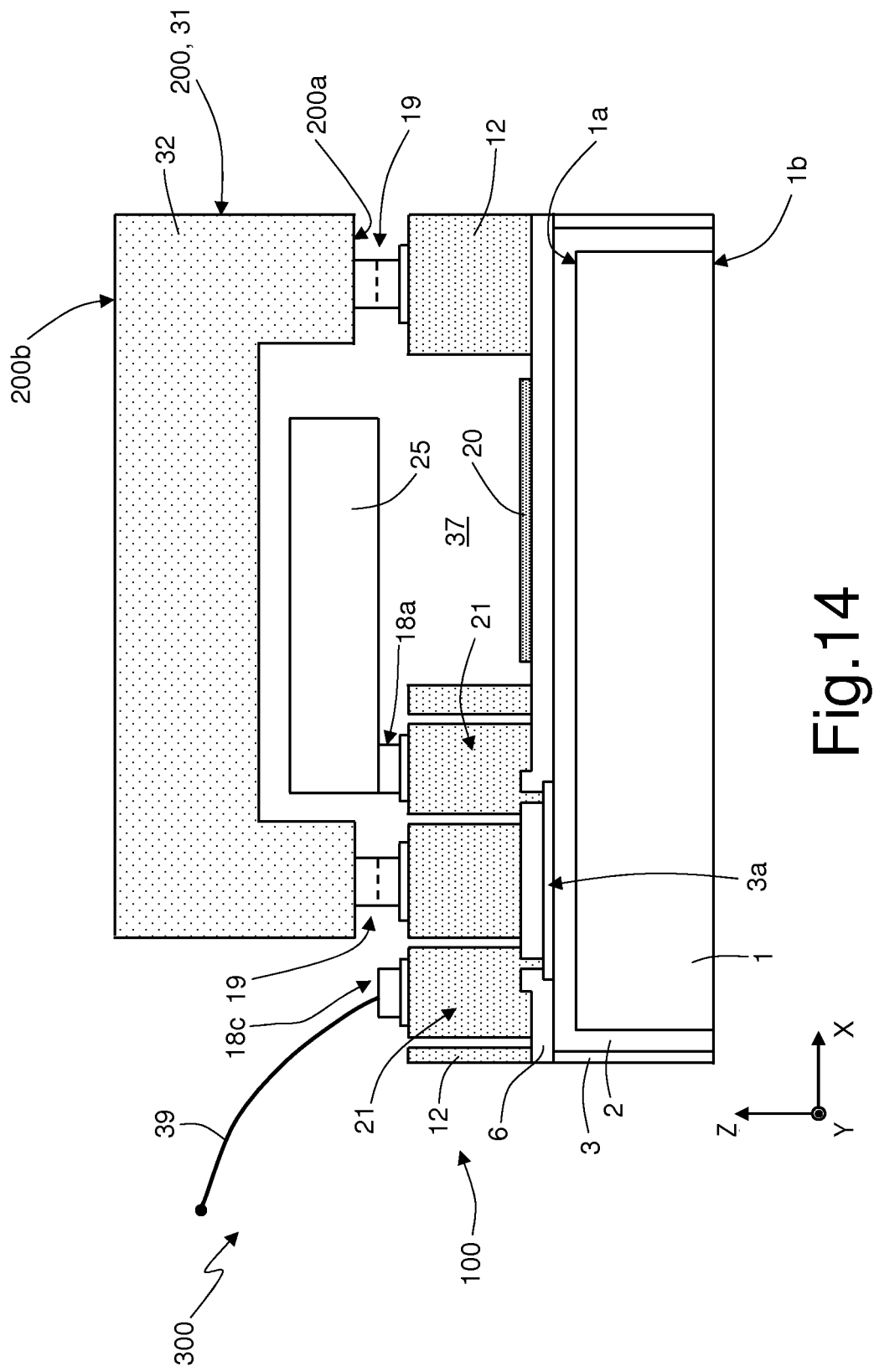

In particular, the oscillator device 300 comprises (the numbering according to the embodiment of FIG. 14 is here used): a substrate 1 made of semiconductor material (for example silicon), having a first side 1a and a second side 1b; a structural layer 12, made, in particular, of doped polysilicon, extending over the first side 1a of the substrate 1; and a cap 31 made of semiconductor material (for example, silicon) set on the structural layer 12 and coupled to the latter by a sealing region 19, or coupling region. The sealing region 19 is adapted to couple hermetically the cap 31 to the structural layer 12, so as to form an internal cavity 37 within the oscillator device 300.

In the internal cavity 37, set between the cap 31 and the structural layer 12, is a resonator 25, in particular of a piezoelectric type (for example, a quartz oscillator). The piezoelectric resonator 25 can have any shape; for example, it may be shaped like a beam or a diapason (U shape). Irrespective of the conformation, the resonator 25 is provided with a first end and a second end, between which an electrical control signal (for example, a voltage signal) can be applied to the resonator 25 so as to induce the resonator 25 in oscillation at a desired frequency (in particular, at the resonance frequency of the resonator).

In order to send the electrical control signal to the resonator 25, the oscillator device 300 according to the present disclosure further comprises a first buried conductive path (or strip) 3a and a second buried conductive path (or strip) 3b, which extend between the substrate 1 and the structural layer 12. In addition, the oscillator device 300 comprises a first conductive pad 18a and a second conductive pad 18b, both of which are housed in an area at the surface of the structural layer 12 in the internal cavity 37. The first conductive pad 18a is electrically coupled to a first terminal portion 3a' of the first buried conductive path 3a, whilst the second conductive pad 18b is electrically coupled to a first terminal portion 3b' of the second buried conductive path 3b. Said electrical couplings are formed through respective conductive regions 21 of the structural layer 12 itself. Said conductive regions 21 are electrically insulated from the rest of the structural layer 12 by means of respective trenches 16, filled with dielectric material (for example, silicon oxide or air). The first conductive pad 18a is hence electrically coupled to one of the conductive regions 21 and, via the latter, to the first buried conductive path 3a; the second conductive pad 18b is, instead, electrically coupled to the other conductive region 21 and, via the latter, to the second buried conductive path 3b.

Moreover housed outside the internal cavity 37 are a third conductive pad 18c and a fourth conductive pad 18d, electrically coupled to the second terminal portions 3a'', 3b'', respectively, of the first and second conductive paths 3a, 3b. In this way, it is possible to send the electrical control signal at input to the resonator 25 from the outside of the cavity 37, through the first and second buried conductive paths 3a, 3b.

According to one embodiment of the present disclosure (shown in FIG. 14), the third and fourth conductive pads 18c, 18d are set in an area corresponding to the side 1a of the substrate 1 and are electrically connected to the second terminal portions 3a'', 3b'' of the first and second buried conductive paths 3a, 3b in a way similar to what has been described with reference to the connection between the first and second conductive pads 18a, 18b and the first terminal portions 3a', 3b' of the first and second buried conductive paths 3a, 3b. In particular, the third and fourth conductive pads 18c, 18d are coupled to the first and second buried conductive paths 3a, 3b through respective conductive regions 21 of the structural layer 12 itself. Said conductive regions 21 are electrically insulated from the rest of the structural layer 12 by means of respective trenches 16, filled with dielectric material (for example, silicon oxide or air).

According to a different embodiment (see, for example, FIGS. 15 and 16) of the present disclosure, the third and fourth conductive pads 18c, 18d are housed in an area corresponding to the second side 1b of the substrate 1 and are electrically connected to the second terminal portions 3a", 3b" of the first and second buried conductive paths 3a, 3b by means of conductive vias, which extend through the entire substrate 1.

In what follows, with reference to FIGS. 1-14, a process for manufacturing the oscillator device 300 is now described. Variants to the process described are illustrated with reference to FIGS. 15-18.

The manufacturing steps are shown with joint reference to cross-sectional views and top plan views, for greater clarity. In particular, FIGS. 1-3 and 4a-11a are side views of one and the same cross section of a wafer 100 during successive manufacturing steps. FIGS. 4b-11b are top plan views of one and the same region of the wafer 100 during the same manufacturing steps as those of FIGS. 4a-11a, respectively. In particular, the cross-sectional views of FIGS. 4a-11a are taken along one and the same line of section I-I shown in FIGS. 4b-11b.

Figure 1:
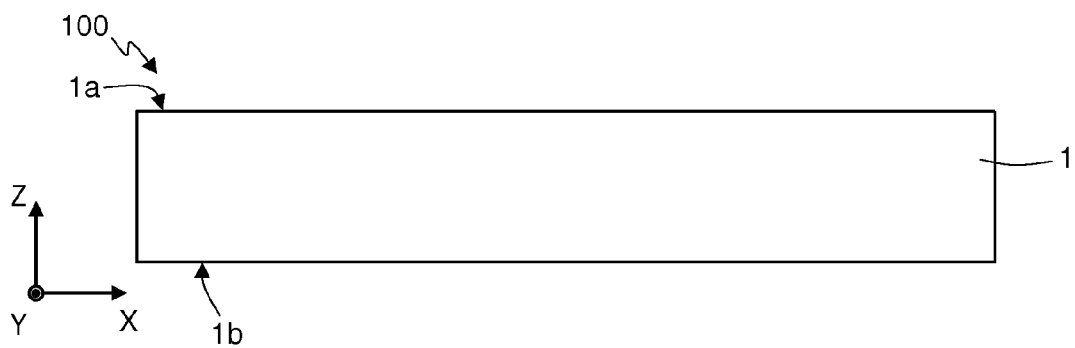
FIGS. 1 to 14 show successive manufacturing steps for producing an oscillator device according to one embodiment of the present disclosure.
Figure 2:
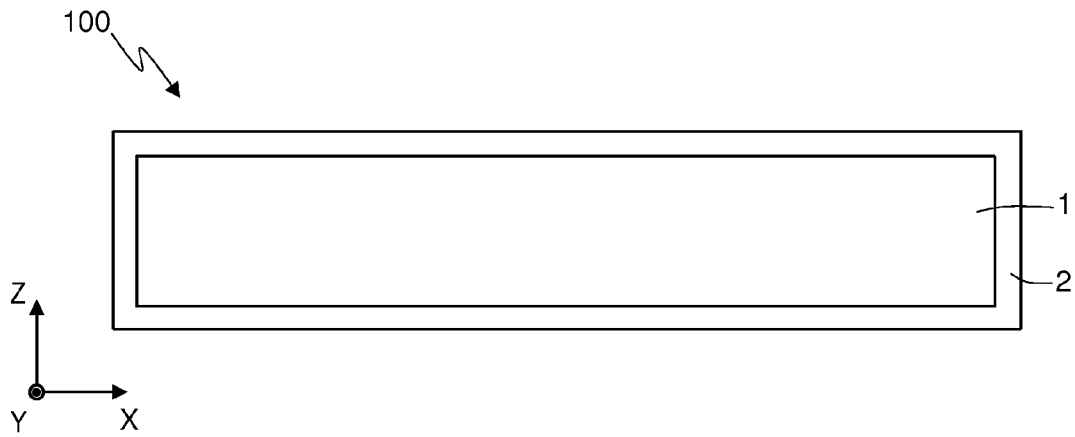

With reference to FIG. 1, a wafer 100 is provided, comprising a substrate 1 made of semiconductor material, in particular silicon. The substrate 1 has a first side 1a and a second side 1b, opposite to one another.

Next (FIG. 2), formed on both of the sides 1a and 1b of the substrate 1 is an insulating layer 2, made, for example, of silicon oxide (SiO$_2$). The insulating layer is formed, for example, by means of a thermal-oxidation process, by introducing the substrate 1 into a furnace the internal atmosphere of which, at a temperature of between approximately 800° C. and 1200° C., contains pure oxygen or oxygen in the form of water vapor. Alternatively, the insulating layer 2 can be deposited, by means of techniques of a known type, exclusively on the side 1a. The insulating layer 2 can be made of an insulating material different from silicon oxide, for example silicon nitride or yet other materials.

Figure 3:
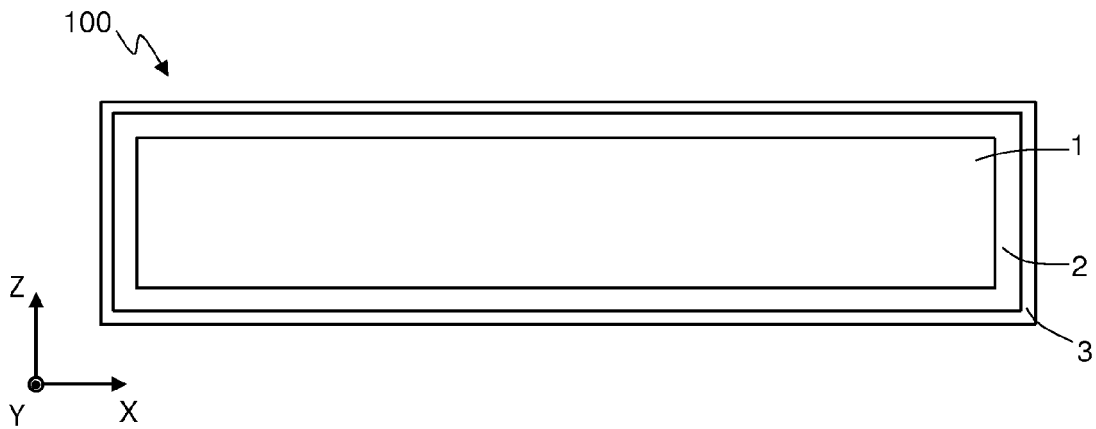
Figure 4A:
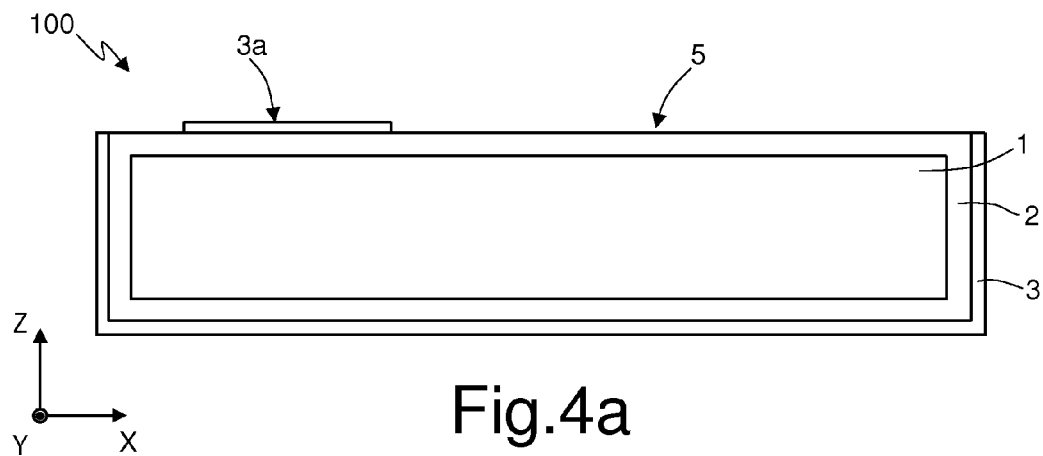
Figure 4B:
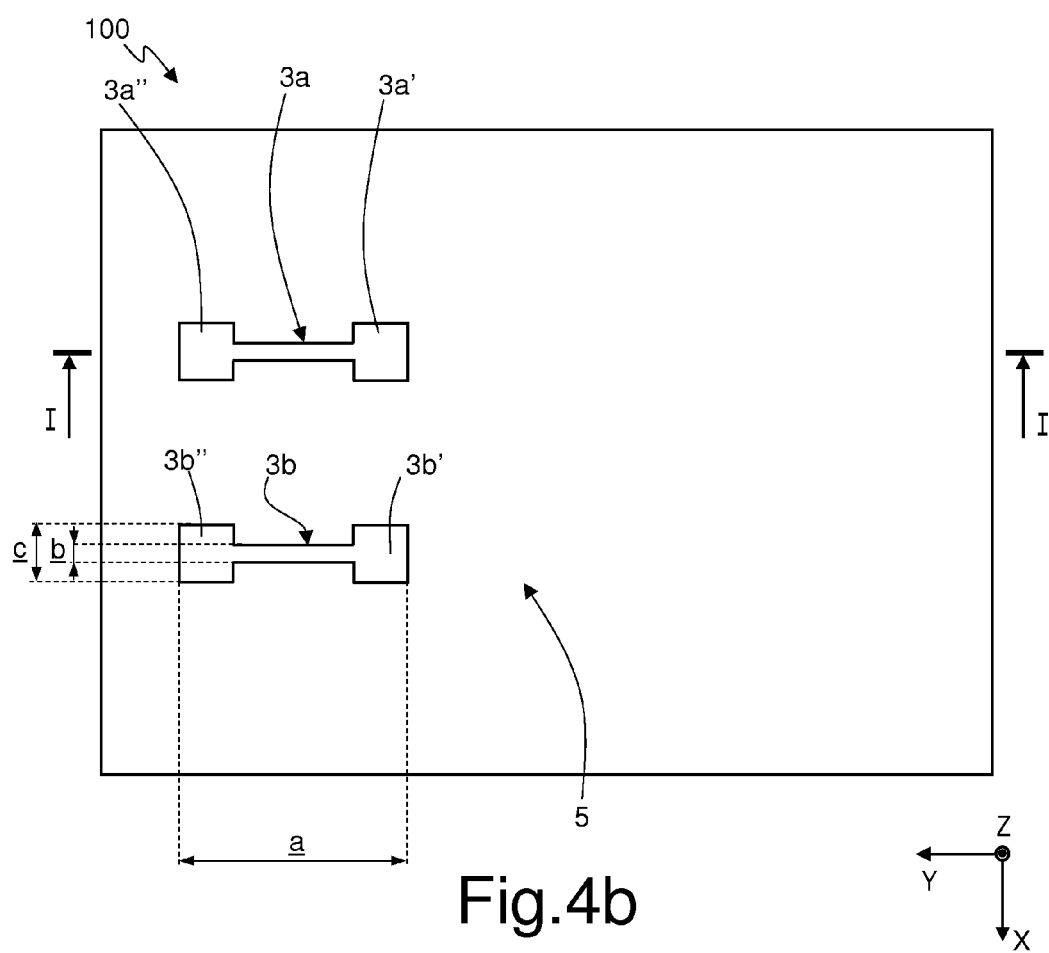
Figure 5A:
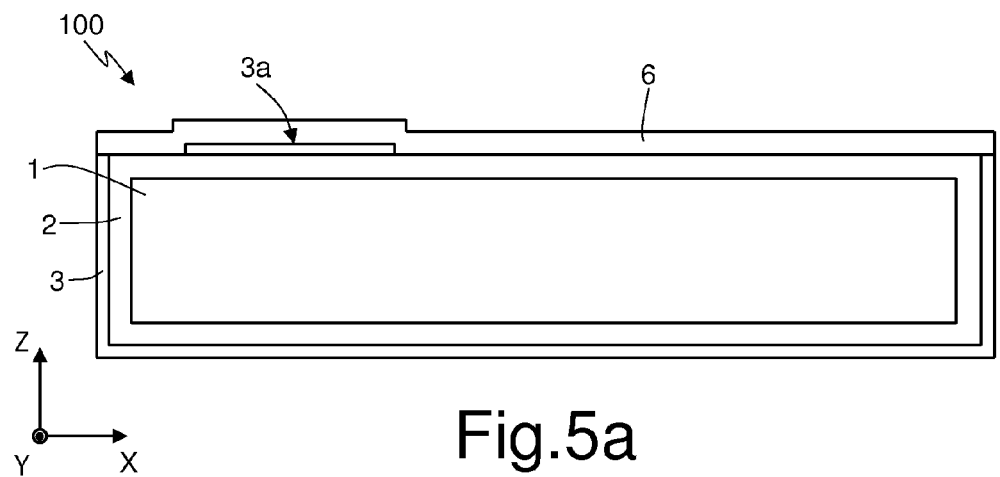
Figure 5B:
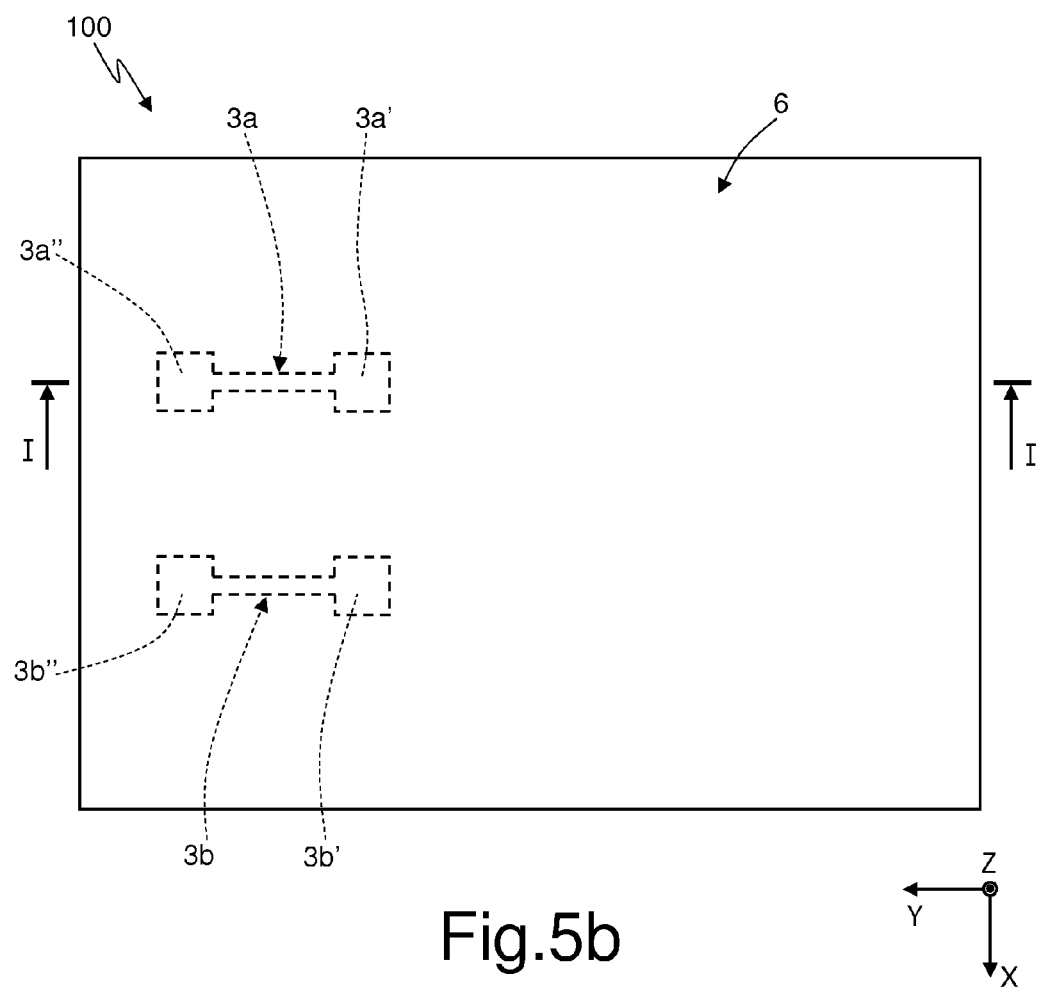
Figure 6A:
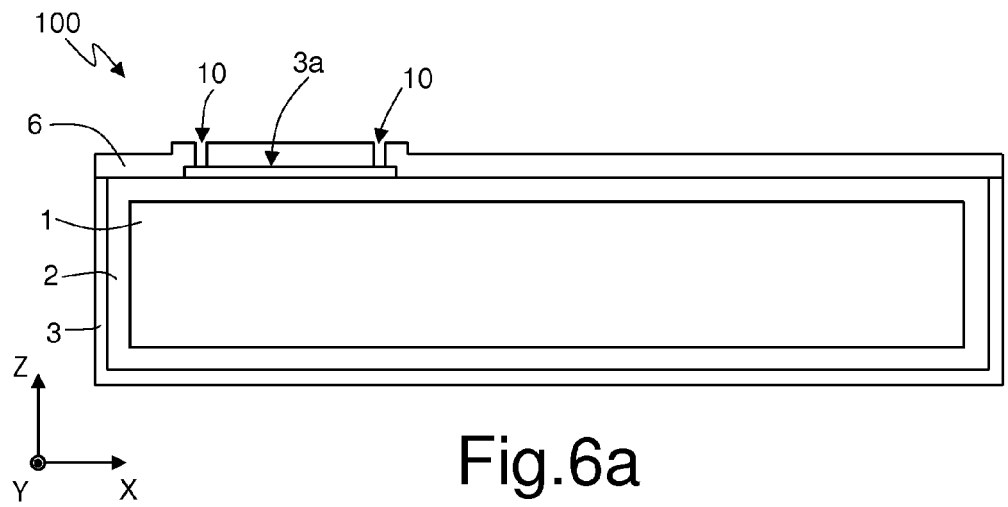
Figure 6B:
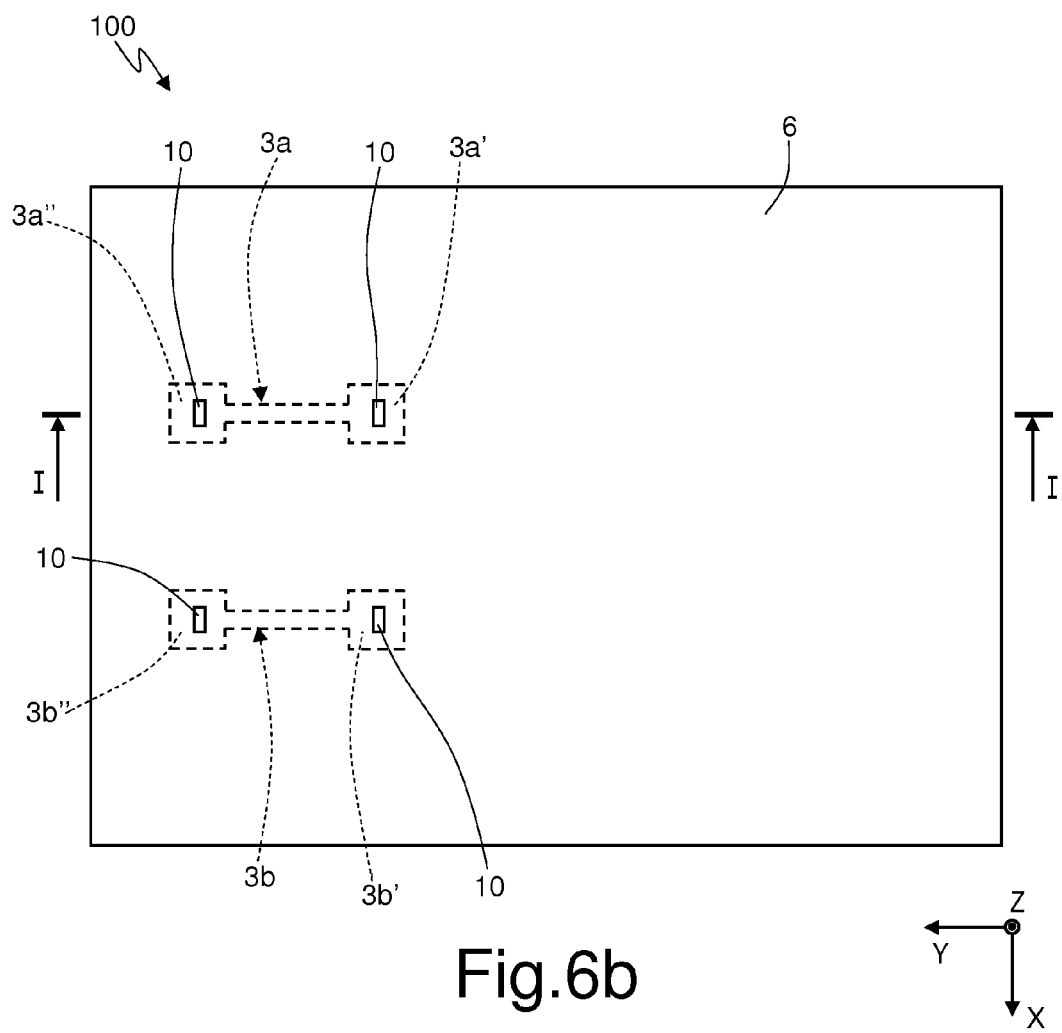
Figure 7A:
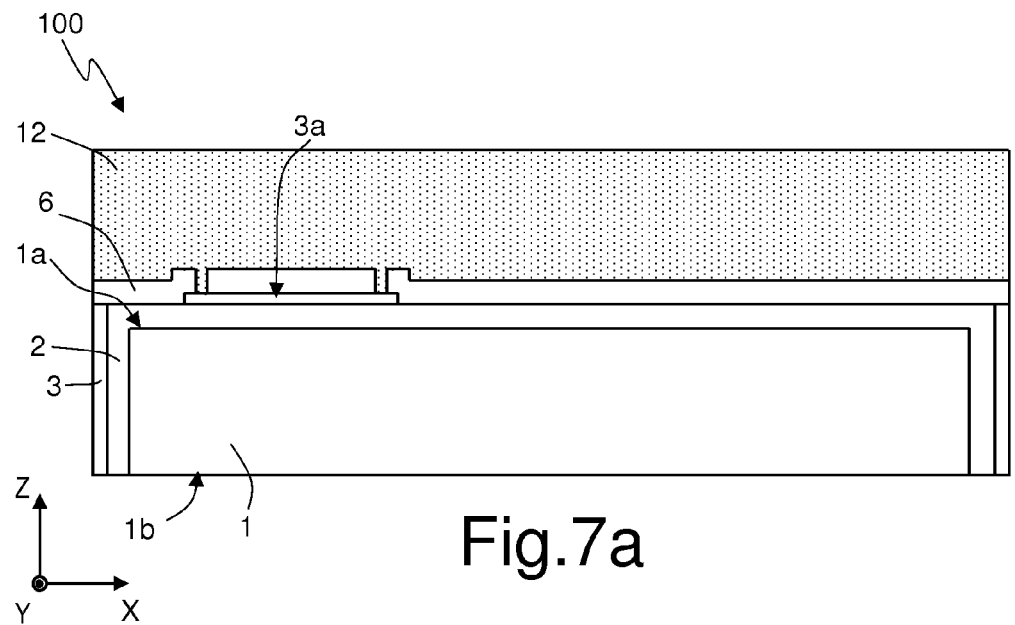
Figure 7B:
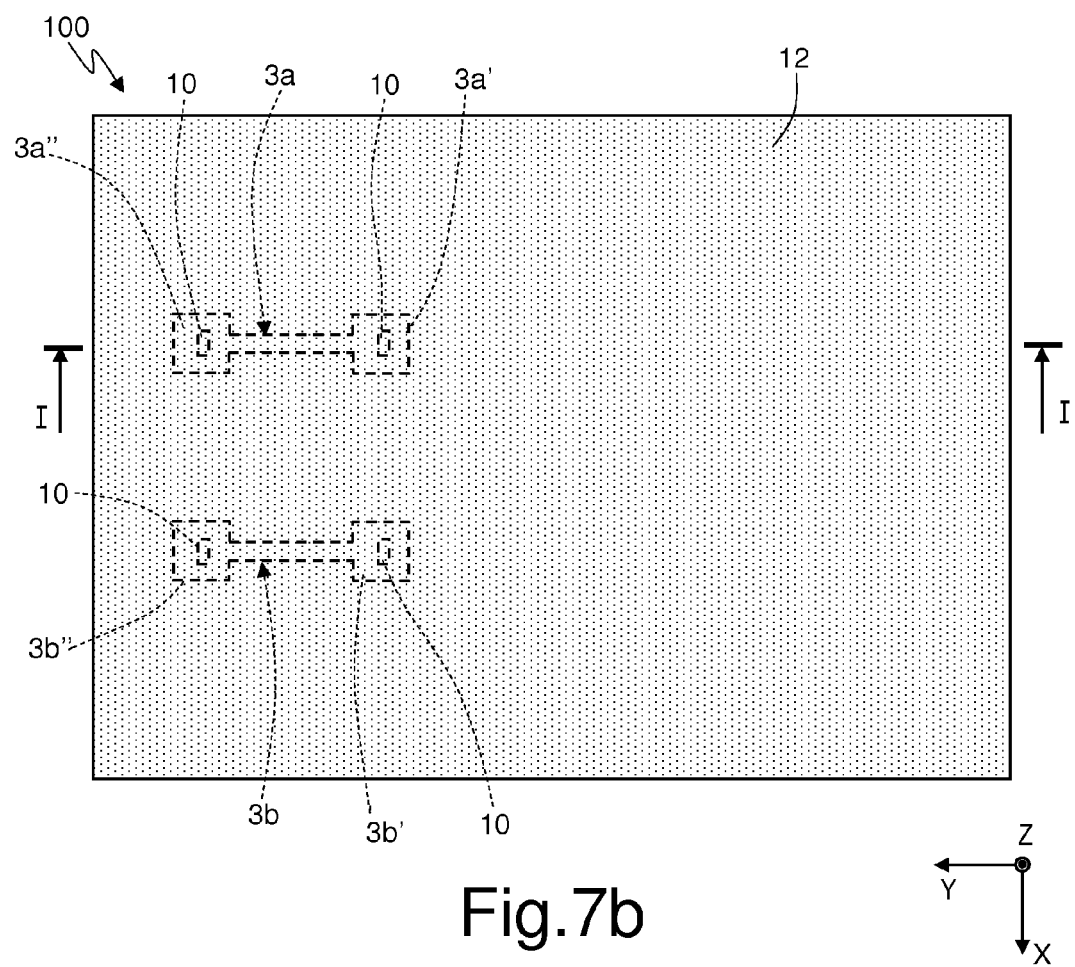

Then (FIG. 3), an interconnection layer 3, made of conductive material, for example, doped polysilicon, is formed at least on the first side 1a of the substrate 1, electrically insulated from the substrate 1 by means of the insulating layer 2. According to what is shown in FIG. 3, the interconnection layer 3 is formed on the entire substrate 1, on top of and in direct contact with the insulating layer 2. The interconnection layer 3 is then defined as shown in FIGS. 4a and 4b, which are, respectively, a cross-sectional view, taken along a plane XY, and a top plan view (i.e., viewed looking down on the side 1a), taken along a plane XZ, of the wafer 100 in one and the same processing step. In detail, by means of a masked-etching step (for example, comprising successive steps of deposition of a photoresist layer, lithography and selective etching), the interconnection layer 3 is removed in areas corresponding to portions 5 formed on the first side 1a of the substrate 1 so as to form conductive strips 3a, 3b of the type shown in FIG. 4b. The conductive strips 3a, 3b (two conductive strips are shown in FIG. 4b, but these may be any in number, according to the need) extend over the first side 1a of the substrate 1 and have an elongated shape having a main direction of extension along a Y axis and a secondary direction of extension along an X axis, orthogonal to the Y axis. The conductive strips 3a, 3b each have a pair of ends 3a', 3a" and, respectively, 3b', 3b". According to the embodiment of FIG. 4b, the conductive strips 3a, 3b have ends of a quadrangular (or generically polygonal) shape. According to one embodiment, the conductive strips 3' each have: a dimension a (extension along the Y axis) of some hundreds of micrometers (for example, between approximately 100 μm and 400 μm, in particular 300 μm); a dimension b (minimum extension along the axis X) of some micrometers (for example, between approximately 1 μm and 5 μm, in particular 2 μm); and a dimension c (maximum extension along the axis X, at the end 3") of approximately some tens of micrometers (for example, between approximately 10 μm and 100 μm, in particular 50 μm).

It is, however, evident that the ends 3a', 3a", 3b', 3b" can have any shape and size, for example extension c along the axis X equal to or smaller than b.

Next (FIGS. 5a and 5b), an insulating layer 6 is formed on top of the conductive strips 3a, 3b and the exposed regions 5 of the insulating layer 2. The insulating layer 6 has a thickness comprised between approximately 0.8 μm and 2.5 μm, for example, 1.6 μm. The insulating layer 6 is, for example, formed starting from a liquid source (tetraethyl orthosilicate, TEOS) at temperatures comprised between approximately 650° C. and 750° C. The TEOS deposition of the insulating layer 6 presents a good uniformity over the entire surface of the wafer 100, with uniform coating of the steps deriving from the presence of the conductive strips 3a, 3b. Other methods of deposition are possible. In addition, the insulating layer 6 may be made of a generic dielectric material.

Then (FIGS. 6a and 6b), the insulating layer 6 is selectively removed at the ends 3a', 3a", 3b', 3b" of the conductive strips 3a, 3b, so as to form openings 10, which, in subsequent manufacturing steps, will have the function of enabling formation of electrical interconnections. The openings 10 are formed by selectively etching the insulating layer 6 until the conductive strips 3a, 3b are reached and a portion thereof (in particular the ends 3a', 3a", 3b', 3b" of the conductive strips 3a, 3b) is exposed. The openings 10 have a shape chosen according to the need, for example quadrangular, with a base area completely contained within the base area of the ends 3a', 3a", 3b', 3b" (see, for example, FIG. 6b). Other embodiments are, however, possible, and, on account of process variables, the base area of the openings 10 can exceed the base area of the ends 3a', 3a", 3b', 3b".

Next (FIGS. 7a, 7b), formed on top of the insulating layer 6 and in the openings 10 is a structural layer 12, for example, made of doped polysilicon of an N type grown epitaxially. The structural layer 12 has a thickness comprised between some micrometers (e.g., 5 μm) and some tens of micrometers (e.g., 50 μm), in particular 20 μm.

There is then carried out a step of planarization of the second side 1b of the wafer 100 (for example, a CMP process), to remove portions of the insulating layer 2 and of the interconnection layer 3, which extend in an area corresponding to the second side 1b of the substrate 1. This planarization step is optional. Were it deemed expedient, it is moreover possible to carry out a step of thinning of the wafer 100, by means of grinding of the substrate 1 in an area corresponding to the second side 1b.

Next (FIG. 8a), deposited on the structural layer 12 is a metal interface layer and a metal contact layer, which, by means of selective-etching steps, are defined so as to form islands (first metal regions 14a, 14b, and second metal regions 15a and 15b), which extend over the structural layer 12. The first metal regions 14a, 14b are, for example, made of metal such as chromium, titanium, or nickel. The second metal regions 15a and 15b are made of metal material such as, for example, gold. Alternatively, the first metal regions 14a, 14b are made of titanium and the second metal regions 15a and 15b are made of aluminum. The function of the first metal regions 14a, 14b is to guarantee a good adhesion between the structural layer 12 and the second metal regions 15a and 15b. It is evident that, in the case where the second metal regions 15a and 15b are made of a material that does not present problems of adhesion on the structural layer 12 (for example, doped polysilicon), the first metal regions 14a, 14b can be omitted.

Other methods of formation of the second metal regions can be envisaged, for example formation by means of electroplating.

As will be described more fully in what follows, the first metal regions 14b and the second metal regions 15b have the function of electrical-contact pads to form an electrical path with the conductive strips 3a, 3b through portions of the structural layer 12. Instead, the first metal regions 14a and the second metal regions 15a have the function of enabling a bonding with the cap 31 set on the structural layer 12. It is hence evident that, given that the function of the first metal regions 14b and second metal regions 15b is different from that of the first metal regions 14a and second metal regions 15a, the latter can be formed by means of techniques different from what has been described above. For example, the first and second metal regions 14a, 15a can be replaced by low-viscosity glass regions, to provide a bonding of a "glass frit" (also known as "glass soldering" or "seal glass bonding") type.

Figure 8A:
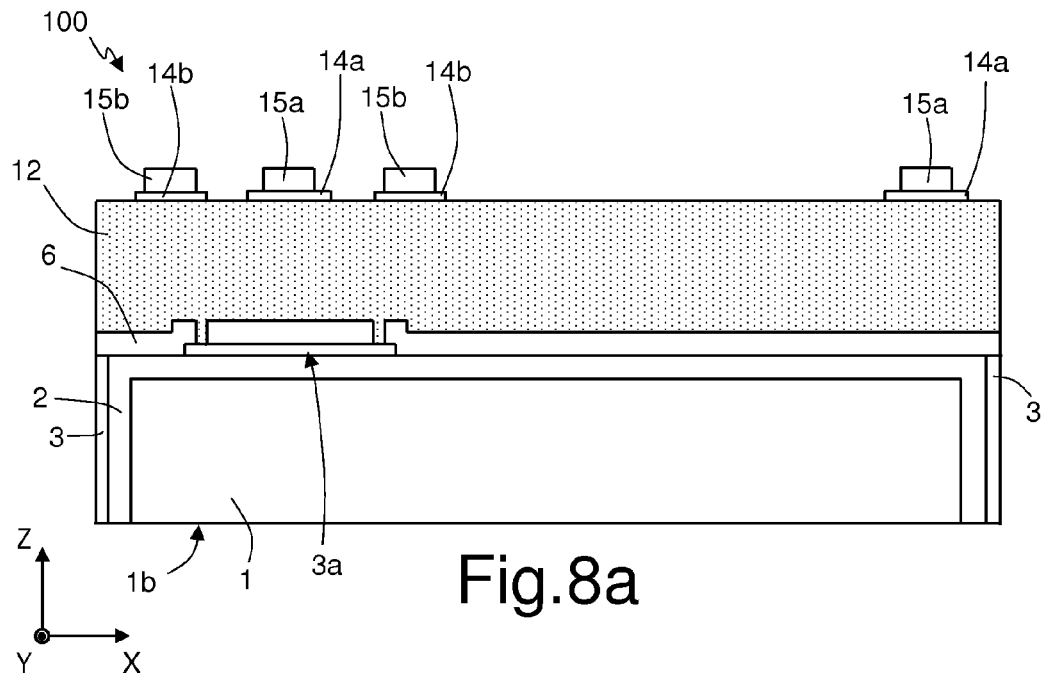
Figure 8B:
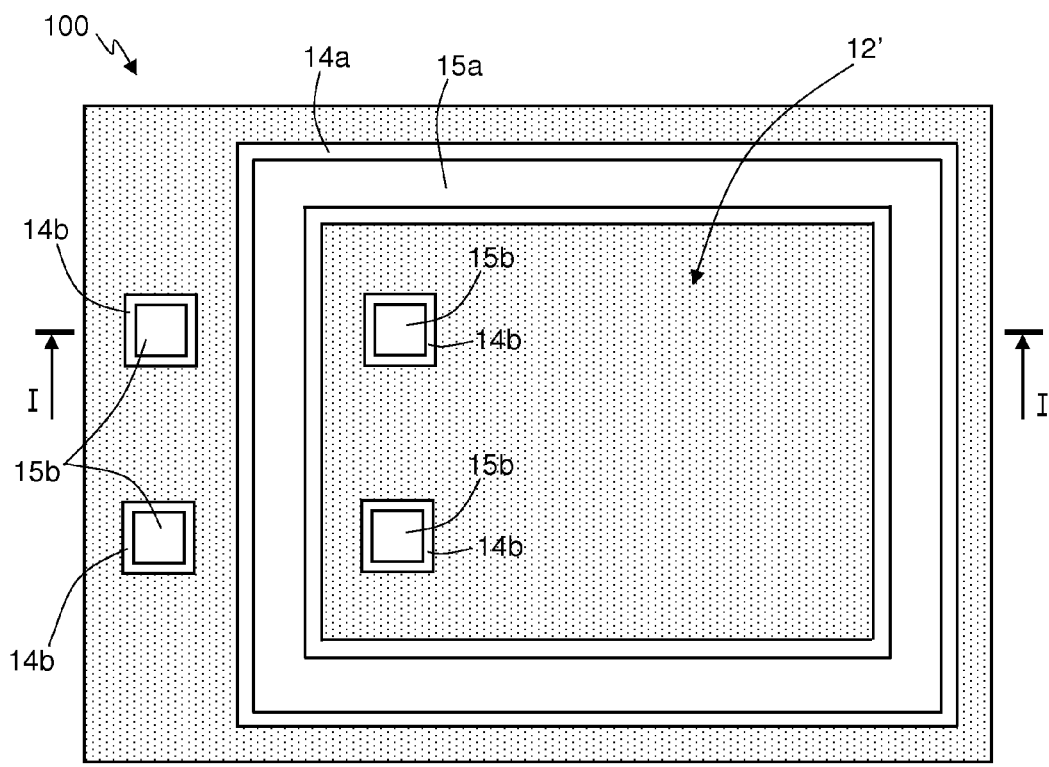
Figure 9A:
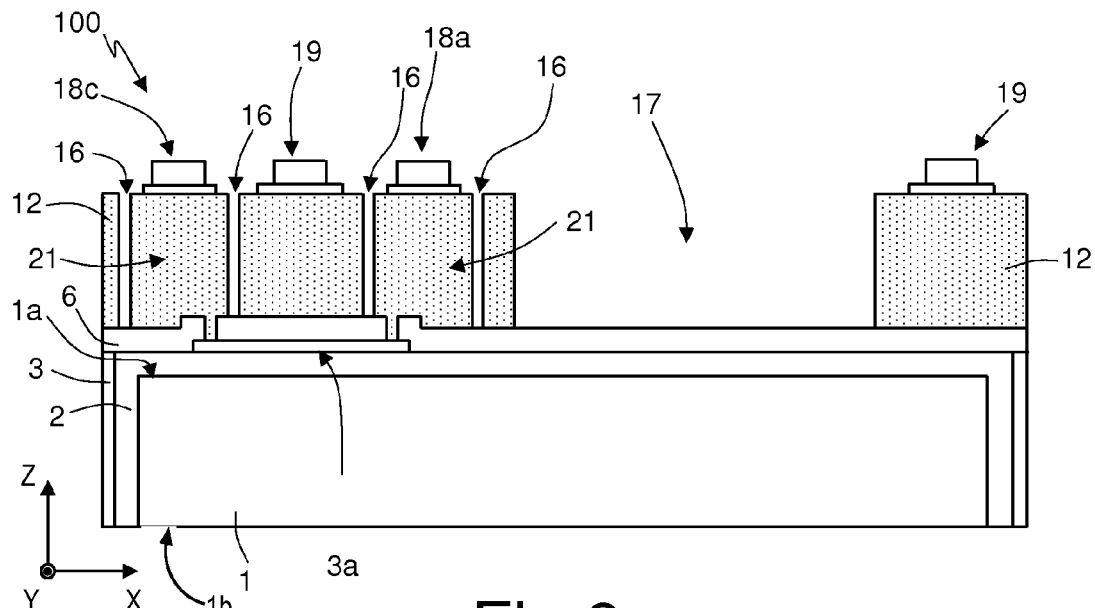
Figure 9B:
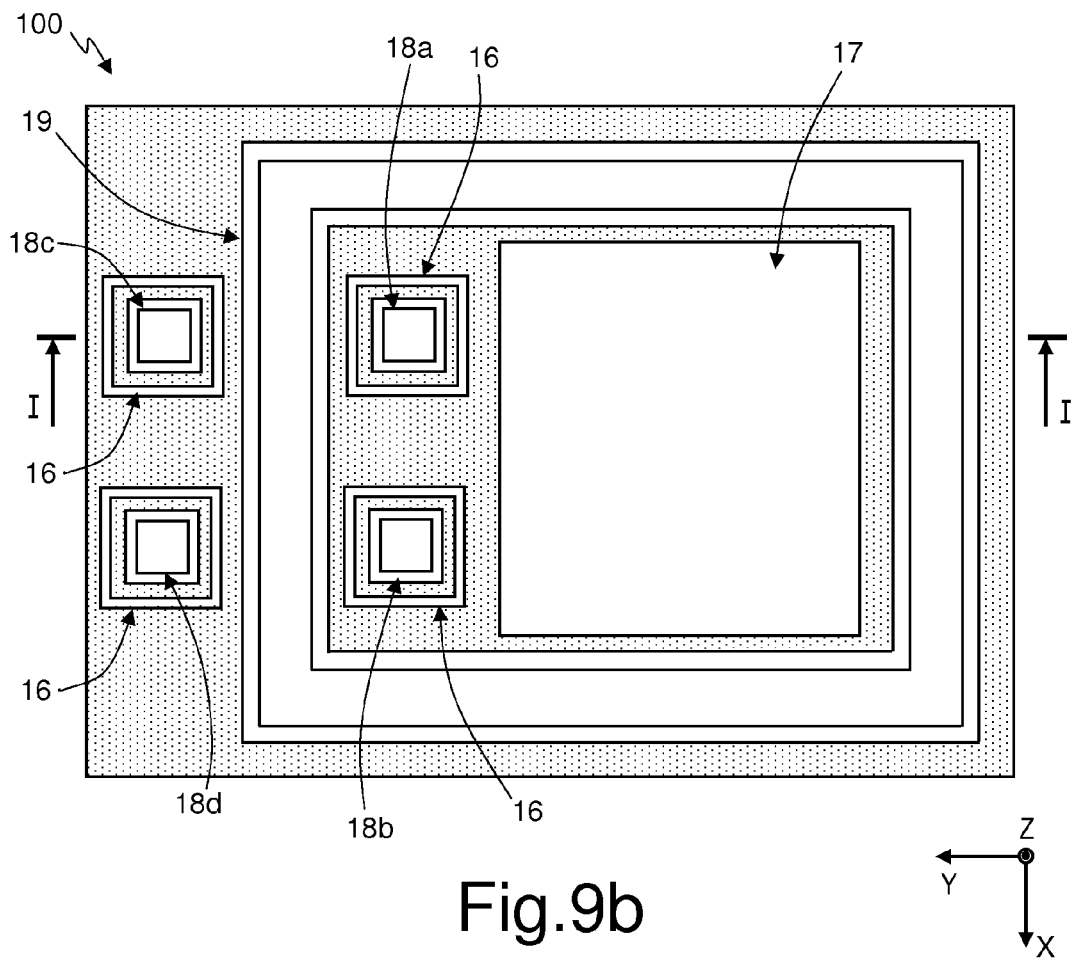
Figure 10A:
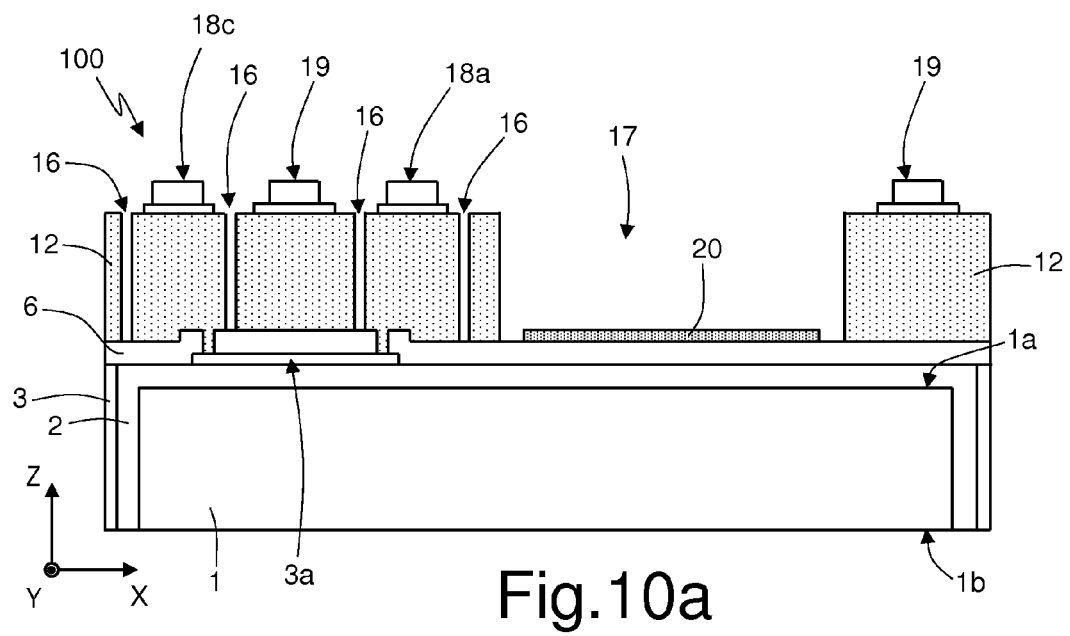
Figure 10B:
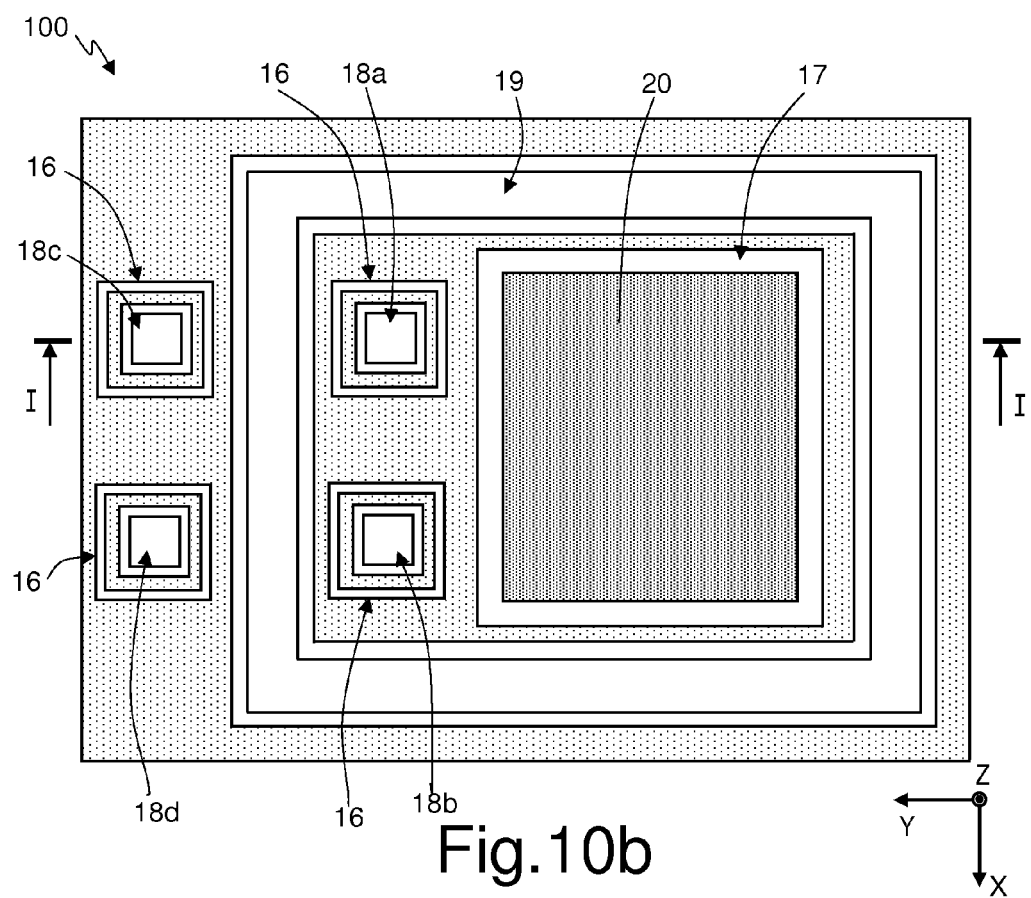

FIG. 8b shows in top plan view the wafer 100 comprising the first metal regions 14a, 14b and the second metal regions 15a, 15b. In the sequel of the description, the first metal regions 14b and second metal regions 15b formed in electrical contact with one another are referred to as contact pads 18a-18d, and the first metal regions 14a and second metal regions 15a are referred to as coupling region 19.

The coupling region 19 forms on the structural layer 12 a closed-line path, of a quadrangular shape. Other shapes are, however, possible, for example a circular shape or a generally polygonal closed shape. According to the embodiment of FIG. 8b, the closed path formed by the coupling region 19 defines an internal portion 12' where the structural layer 12 is exposed. The internal portion 12' has an area comprised between approximately 0.2 mm$^2$ and some square millimeters (for example, 3 mm$^2$), in particular 1 mm$^2$. The closed path formed by the coupling region 19 extends over the structural layer 12 in such a way as to be comprised, in top plan view, between the ends 3a' and 3a" of the first conductive strip 3a, and between the ends 3b' and 3b" of the second conductive strip 3b.

The contact pads 18a and 18b are formed in an area corresponding to the internal portion 12' approximately aligned along the Z axis, respectively, to the ends 3a' and 3b' of the conductive strips 3a and 3b.

The contact pads 18c and 18d are formed outside the portion 12' surrounded by the coupling region 19, and are approximately aligned along the Z axis, respectively, to the ends 3a" and 3b" of the conductive strips 3a and 3b.

As is will be understood better in what follows, an exact alignment along the Z axis of the contact pads 18a-18d with the respective ends 3a', 3b', 3a", 3b", even though preferable, is not necessary.

The shape, dimensions, and spatial arrangement of the contact pads 18a-18d is defined by the shape, dimensions, and spatial arrangement chosen for the first metal regions 14b; for example, they can have a quadrangular full shape, or a circular full shape, or other generically polygonal full shape. The shape and dimensions of the second metal regions 15b is chosen in such a way that they will be completely contained within the base area of the respective first metal regions 14b. A possible extension of the second metal regions 15b beyond the base area of the first metal regions 14b due to the process spread is, however, acceptable.

Then (FIGS. 9a and 9b), the structural layer 12 is selectively etched, for example by means of deep reactive ion etching (DRIE), to form a plurality of trenches 16, each of which surrounds completely a respective contact pad 18a-18d. By means of the same etching of the structural layer 12, a recess 17 is formed in the internal portion 12'. The recess 17 is hence completely surrounded, in top plan view, by the coupling region 19. According to one embodiment of the present disclosure, the recess 17 has a quadrangular shape. Other polygonal or circular shapes are, however, possible, chosen according to the need.

The trenches 16 and the recess 17 extend as far as respective portions of the insulating layer 6 until these are exposed.

The trenches 16 define in this way, in the structural layer 12, a plurality of pillars 21 (four in this embodiment), which extend underneath each respective contact pad 18, and approximately vertically aligned therewith along the Z axis.

Each contact pad 18a-18d is hence electrically coupled to a respective end 3a', 3b', 3a", 3b" of the conductive strips 3a, 3b through a respective pillar 21. Each pillar 21 is electrically insulated from the other pillars 21 and from the rest of the structural layer 12 by the respective trenches 16, but is made of the same material as the structural layer 12. In the case where, owing to process defects, the contact pads 18a-18d are not perfectly aligned along the Z axis with a respective end 3a', 3b', 3a", 3b" (and in particular with the opening 10 formed during the step of FIGS. 6a and 6b), it is sufficient to form trenches 16 of a size such as to surround completely both the respective contact pad 18a-18d and the respective end 3a', 3b', 3a", 3b".

Then (FIGS. 10a and 10b), a getter layer 20 is formed inside the recess 17.

The getter layer 20 has the function of generating, in use and when the recess 17 is sealed, an ambient pressure P1 within the recess 17 different from (in particular lower than) the ambient pressure P2 present in the environment external to the recess 17.

The getter layer 20 is usually made of material deposited in the form of layer, and has the function of absorbing specific gas molecules. Materials used as getter layer 20 are known, and comprise for example metals such as aluminum (Al), barium (Ba), zirconium (Zr), titanium (Ti), vanadium (V), iron (Fe), or corresponding mixtures or alloys such as zirconium-aluminum, zirconium-vanadium-iron, zirconium-nickel, zirconium-cobalt (in particular, a Zr/Co/O alloy). The getter layer 20 is, according to one embodiment, of a non-evaporable (NEG) type, provided in the form of a layer on the exposed surface of the insulating layer 6 inside the recess 17. As is known, during the step of formation of the getter layer 20, the material of which the getter layer 20 is made reacts with the surrounding air, causing formation of a passivation layer (typically made of oxide or oxide/nitride), which coats completely the surface area of the getter layer 20, rendering it inactive. Activation of the getter layer 20 takes place (following upon hermetic sealing of the recess 17) by means of local activation in temperature, having the function of removing the passivation layer that has formed on the surface of the getter layer 20 during the step of formation thereof. In this way, the getter layer 20 is activated and operates in a known way reacting with residual gases within the recess 17 (except for noble gases) enabling a reduction of the ambient pressure P1 with respect to the ambient pressure P2.

It is evident that the getter layer 20 can be omitted in the case where, for the specific application, it is not necessary to have an ambient pressure P1 inside the recess 17 different from the ambient pressure P2 outside the recess 17, or in the case where the step of sealing of the recess 17 occurs in a controlled atmosphere, at the desired pressure P1.

Next (FIGS. 11a and 11b), a step of attach of a piezoelectric resonator 25 above the recess 17 is carried out. The piezoelectric resonator 25 is, for example, a crystal oscillator, in particular a quartz oscillator.

Figure 11A:
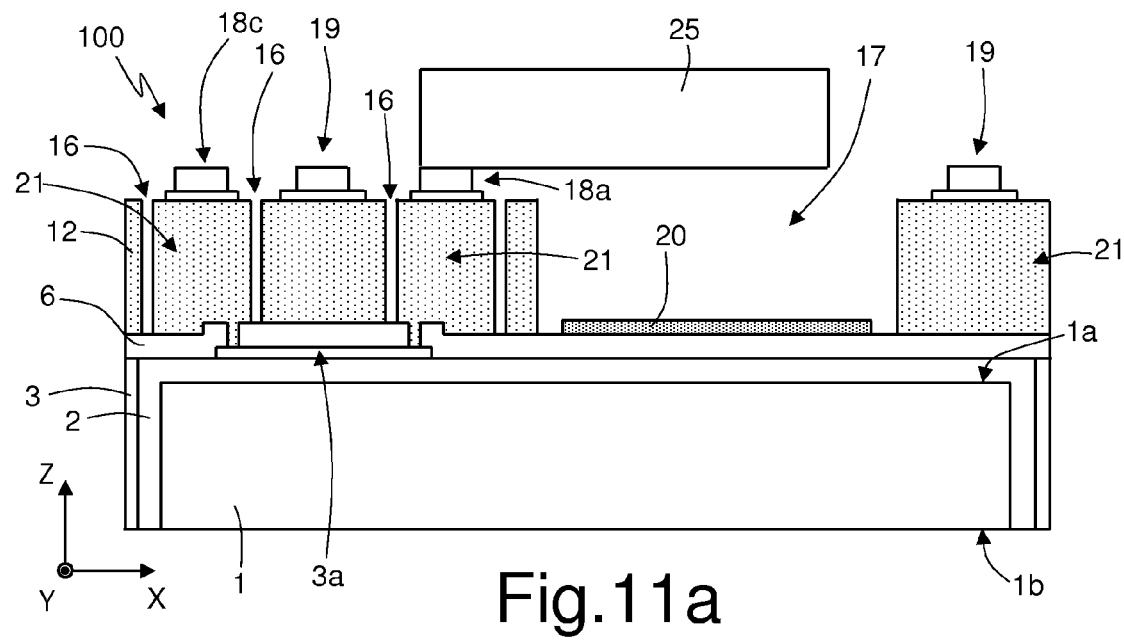
Figure 11B:
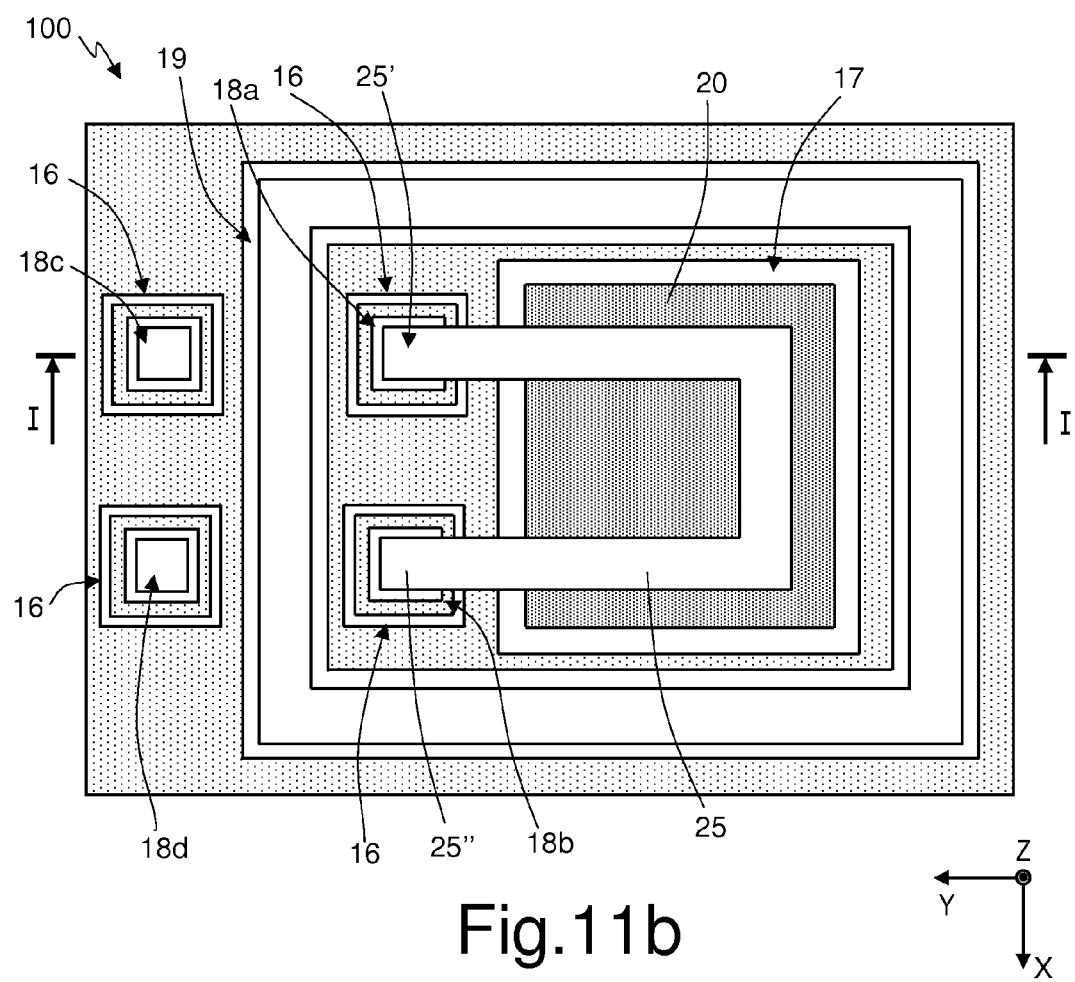

As may be seen more clearly in FIG. 11b, the piezoelectric resonator 25 is substantially U-shaped, provided with two ends 25' and 25". Each of the ends 25', 25" is coupled to a respective electrical-contact pad 18a, 18b, for example by means of soldering balls. The piezoelectric resonator 25 is coupled to the electrical-contact pads 18a, 18b by means of the flip-chip technique. The piezoelectric resonator 25 moreover extends in cantilever fashion above the recess 17, in such a way that, in use, it can oscillate freely.

The piezoelectric resonator 25 is produced in a way in itself known and does not form the subject of the present disclosure and consequently is not described in detail herein.

Figure 12A:
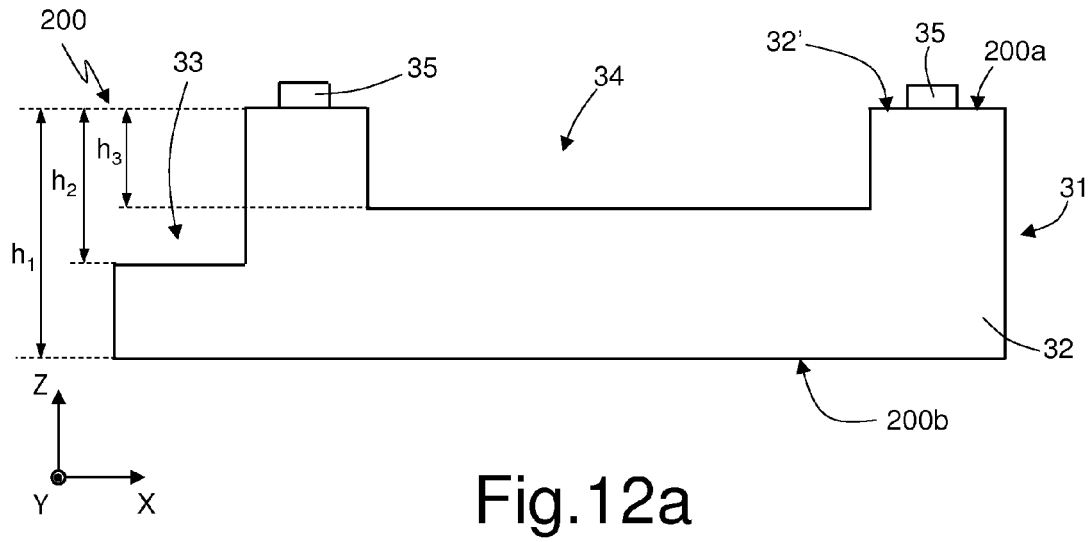
Figure 12B:
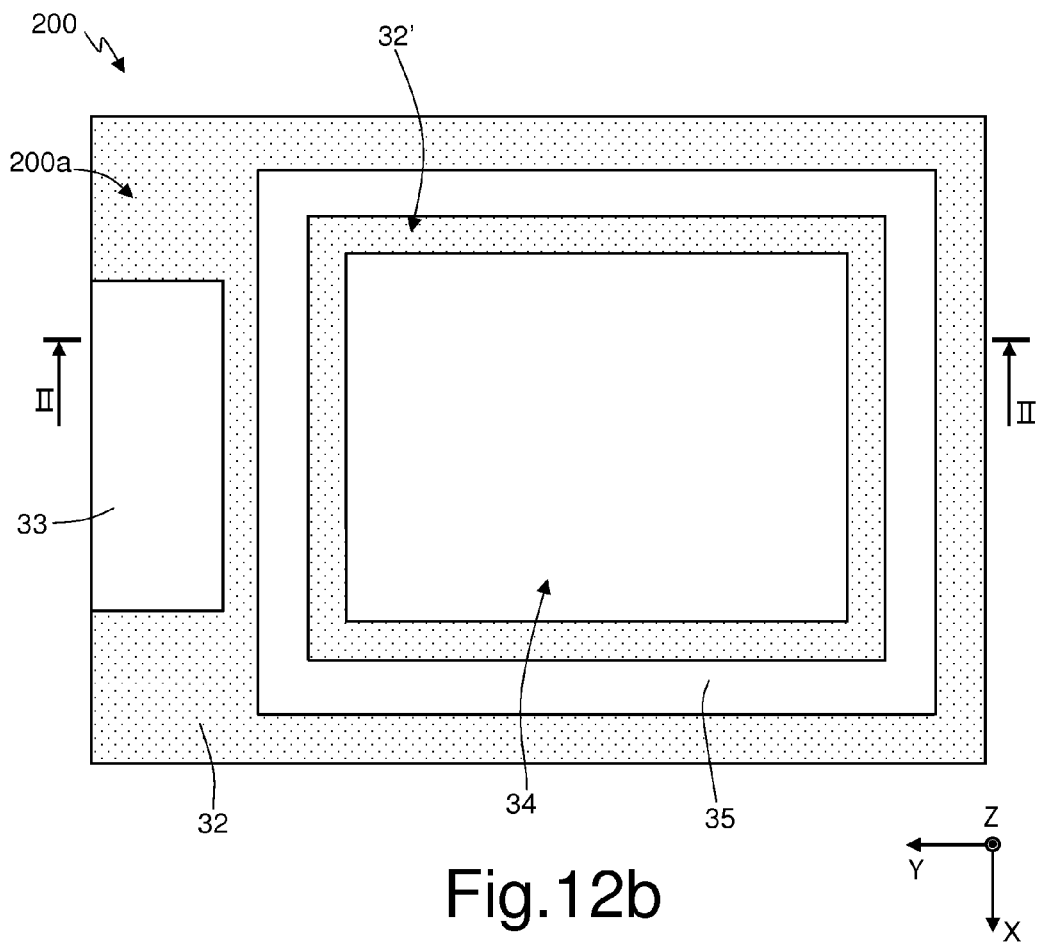

FIG. 12a shows, in cross-sectional view along the line of section II-II of FIG. 12b, a wafer 200 (having a first side 200a and a second side 200b opposite to one another) machined in such a way as to form the cap 31 designed to seal the recess 17 hermetically, protecting the piezoelectric resonator. FIG. 12b shows the wafer 200 in top plan view, from the side 200a.

The wafer 200 comprises a substrate 32 made of semiconductor material, for example the same material as the one used for the substrate 1 of the wafer 100, in particular silicon, or a semiconductor material different from the one used for the substrate 1 of the wafer 100. The wafer 200 is machined following micromachining steps of a known type, to form a first recess 33 and a second recess 34, which have a depth, within the substrate 32 starting from the side 200a, different from one another. For example, in the case where the starting substrate 32 has a thickness $h_1$ of approximately 725 μm, the first recess 33 extends in the substrate 32, starting from the side 200a, for a depth $h_2$ of approximately 400 μm, whereas the second recess 34 extends in the substrate 32, starting from the side 200a, for a depth $h_3$ lower than $h_2$ and of approximately 200 μm. In general, the depth of the first recess 33 is defined on the basis of the thickness of the resonator 25 and of the space for housing it.

The wafer 200 further comprises, formed on the side 200a, a coupling region 35 made of metal material formed by means of deposition and selective etching of a layer made, for example, of gold, or some other metal material. The shape and spatial extension of the coupling region 35 are such as to be approximately the same as the shape and spatial extension of the coupling region 19 of the wafer 100. In fact, as described in subsequent steps, the coupling region 19 and the coupling region 35 are configured so as to be set in direct contact with one another and be hermetically bonded to one another, with a technique of the wafer-bonding type (with possibility of using different types of bonding processes, for example eutectic or thermocompressive metal bonding, or else bonding of a glass-frit type or by means of polymers).

Figure 13:
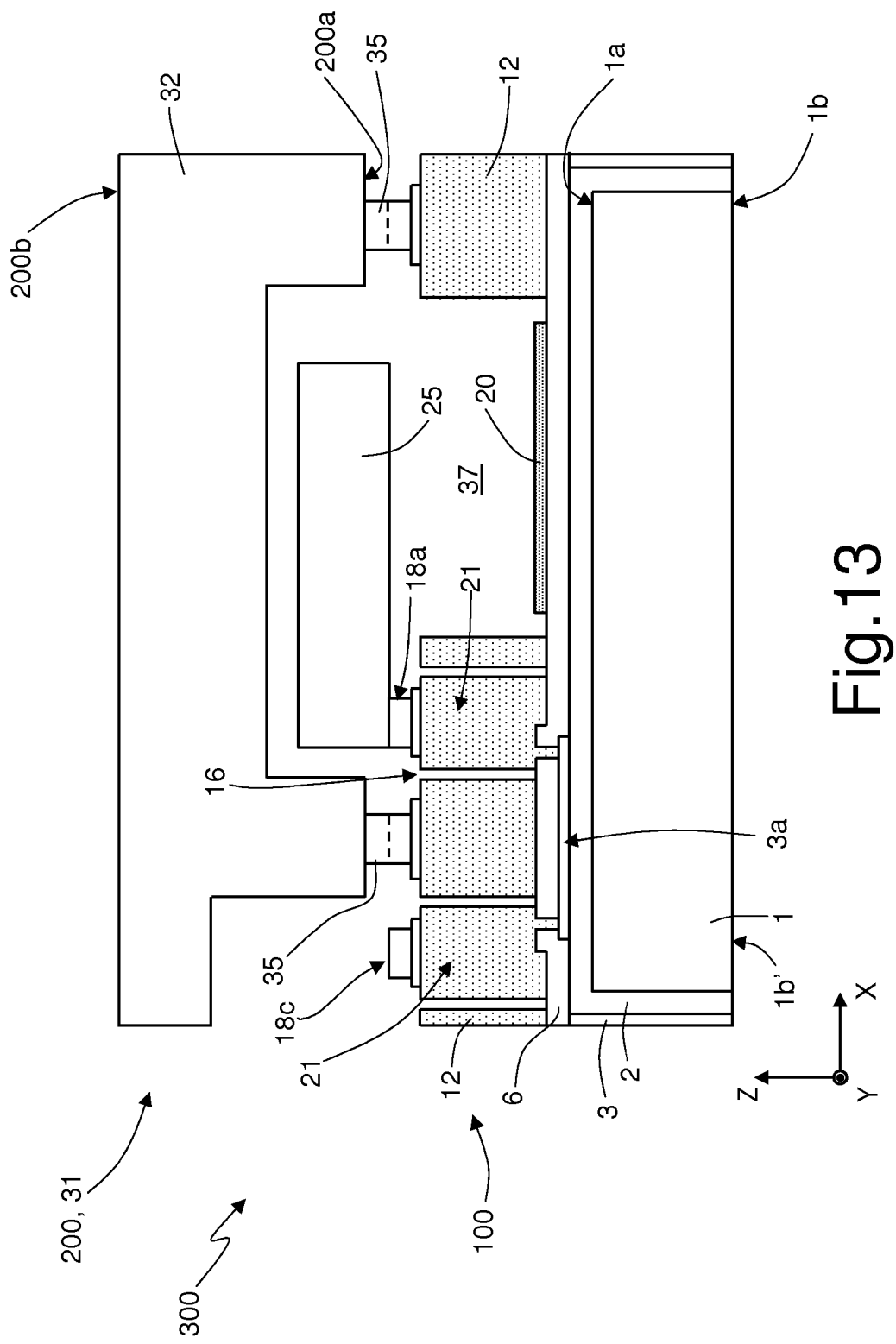

The coupling region 35 consequently forms, above the substrate 32, a closed-line path such as to surround a portion 32' of the substrate 32 at the top. The second recess 34 is formed by means of masked etching in the portion 32' of the substrate 32, within the area enclosed by the coupling region 35. The spatial extension of the recess 34 is greater than the spatial extension of the recess 17, and in particular, as may be seen more clearly in FIG. 13, is such as to house partially (when the cap 31 is set on the recess 17) the piezoelectric resonator 25. According to one embodiment of the present disclosure, the second recess 34 has a quadrangular shape. Other shapes are, however, possible, for example, a generically polygonal shape.

The first recess 33 extends, instead, outside the coupling region 35, in an area corresponding to the portion of the substrate 32, which, when the cap 31 is set on the wafer 100 and on the recess 17, is aligned (along the Z axis) with the contact pads 18c and 18d.

The first and second recesses 33, 34 are formed, for example by means of successive masked etches, for example, using DRIE processes or by means of TMAH. According to this embodiment, a mask is formed (in a way not shown in the figure) over the entire side 200a of the wafer 200 except for the region where the recess 33 is to be formed, and a first etch is carried out so as to dig the substrate 32 for a depth given by approximately $h_2$-$h_3$. Then, the mask is removed and a new mask is formed over the entire side 200a of the wafer 200 except for the regions in which the recess 33 (already partially dug) and the recess 34 are to be formed, and a second etch is carried out so as to dig the substrate 32 for a depth given by approximately $h_3$, thus forming the first and second recesses 33, 34. These steps can be carried out prior to formation of the coupling region 35, or afterwards, according to the need.

Next, as shown in FIG. 13, the wafer 100 and the wafer 200 are bonded together (step known as "wafer-to-wafer bonding") in such a way that the respective coupling regions 19 and 35 will be aligned to one another and in direct contact with one another. A subsequent step of thermal treatment (for example, eutectic bonding, thermocompression or the like) enables partial melting of the metal of the coupling regions 19 and 35, which are bonded to one another. There is thus formed a package 300 having an internal cavity 37 hermetically isolated from the outside of the package and the volume of which is given substantially by the volume of the recess 17 and by the volume of the recess 34. The internal cavity 37 houses the piezoelectric resonator 25 and, when present, the getter layer 20.

Next (FIG. 14), a step of thinning of the wafer 200 is carried out in an area corresponding to the side 200b for a thickness equal to approximately $h_1$-$h_2$, so as to expose the contact pads 18c, 18d at the top. Said step is carried out by means of a grinding process of a known type.

Further steps comprise formation of electrical contacts 39 (in this embodiment by means of wire bonding) between the pads 18c, 18d and an external voltage generator, designed to generate the control signal of the piezoelectric resonator 25 to induce it into a state of oscillation.

Figure 15:
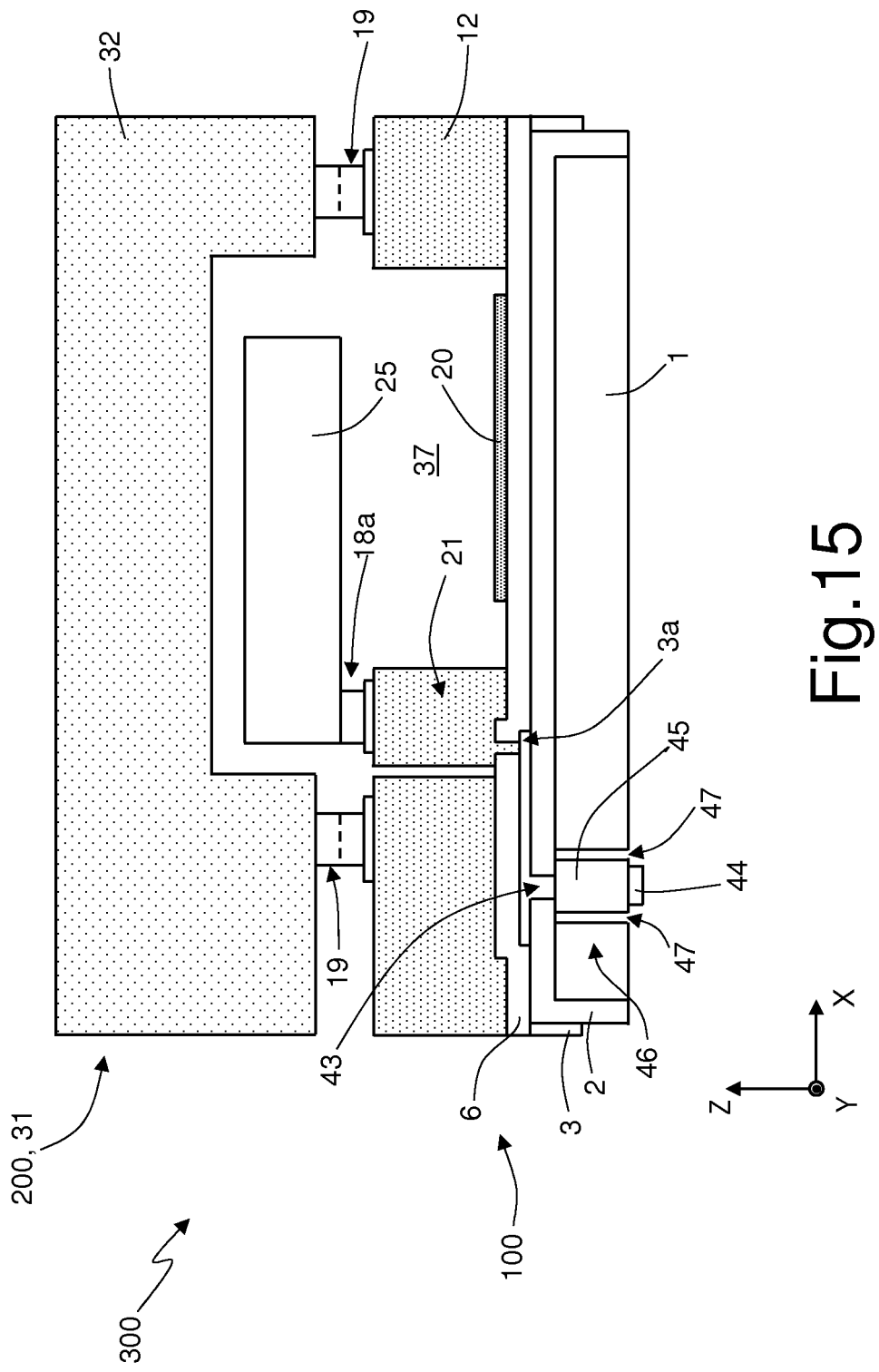
FIGS. 15-18 show respective oscillator devices according to further respective embodiments of the present disclosure.

FIG. 15 shows an alternative embodiment, in which the pads 18c, 18d are not present. The electrical contact for biasing the piezoelectric resonator 25 is obtained through conductive vias formed in the substrate 1, starting from the surface of the second side 1b of the substrate 1. In this case, following upon the steps described with reference to FIGS. 1 and 2, the insulating layer 2 is etched so as to form two openings (as far as the substrate 1) in the regions in which, in steps subsequent to those of FIG. 2, respective ends 3a''', 3b''' of the conductive strips 3a, 3b will be formed. During the subsequent step of deposition of the interconnection layer 3, said openings are filled with the same material with which the interconnection layer 3 is formed, for example doped polysilicon. Respective conductive channels 43 are thus formed between the substrate 1 and the interconnection layer 3. The manufacturing steps then proceed as already described (except, as has been said, that the conductive pads 18c, 18d are not formed). Moreover, with reference to the steps for obtaining the cap 31, not even the first recess 33 is formed. Conductive vias 46 are, instead, formed through the substrate 1 by selectively doping (for example, with dopants of an N type) regions of the substrate 1, which extend aligned, along the Z axis, with the conductive channels 43. Doped regions 45 are thus formed, which extend starting from the surface of the second side 1b until they come into contact with the conductive channels 43. Said doped regions 45 are then insulated from the rest of the substrate 1 by trenches 47, which extend from the surface of the second side 1b until they come into contact with the insulating layer 2, surrounding the doped regions 45 completely. The trenches 47 can be filled with dielectric material. Pads 44 for electrically contacting the conductive strips 3a, 3b are, in this embodiment, formed on the back of the substrate 1 (i.e., on the side 1b of the substrate 1).

Figure 16:
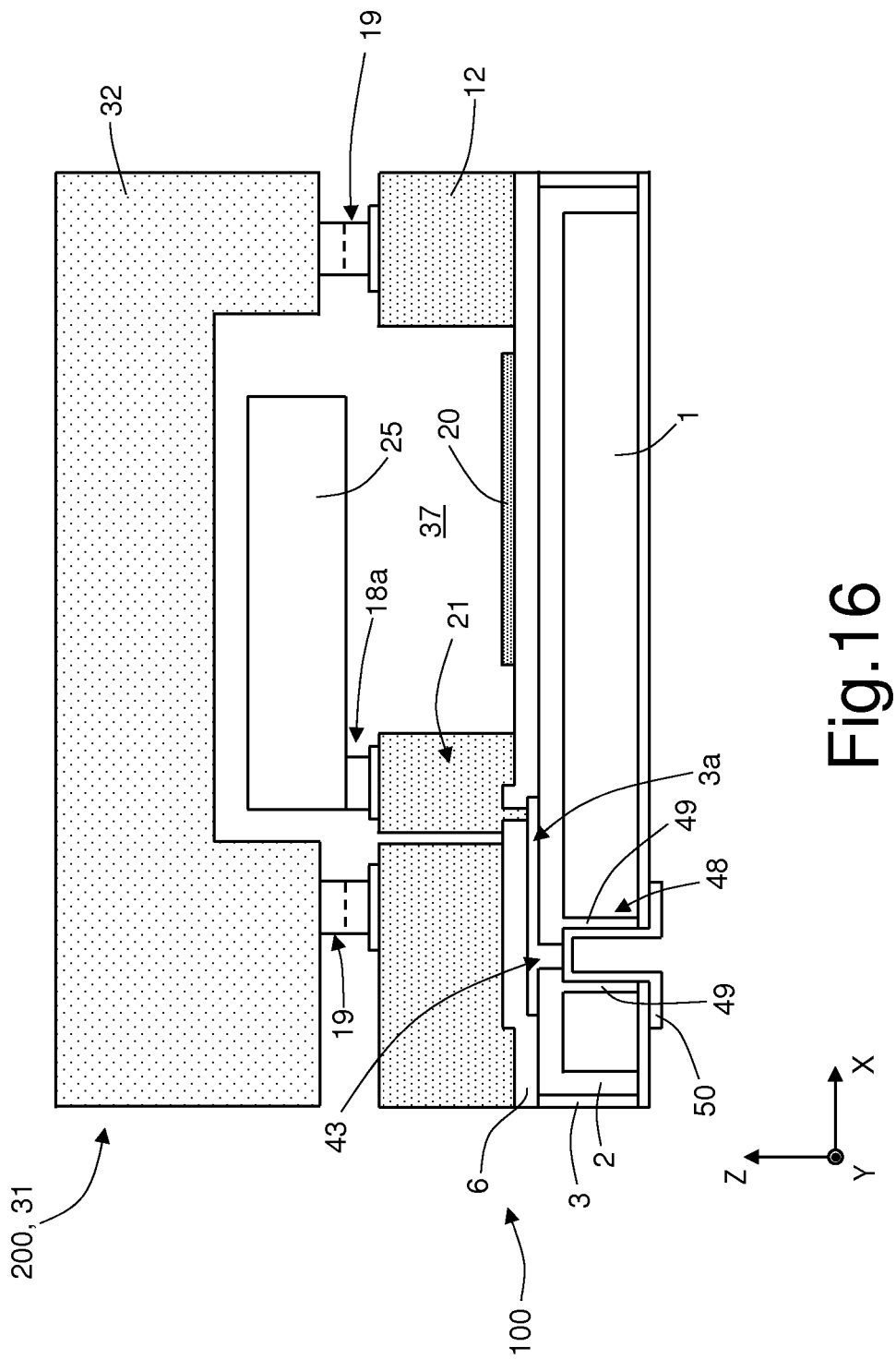

According to a further embodiment, shown in FIG. 16, the conductive vias are formed by digging the substrate 1 so as to form openings that reach the conductive channels 43 and by filling said openings with a layer of conductive material 50, for example metal. In order to insulate electrically the layer of conductive material 50 from the rest of the substrate 1, it is possible to form, prior to deposition of the layer of conductive material 50, a dielectric layer 49 (for example, by depositing dielectric material such as silicon oxide), which extends between the substrate 1 and the layer of conductive material 50, but not in the region of the conductive channels 43.

Figure 17:
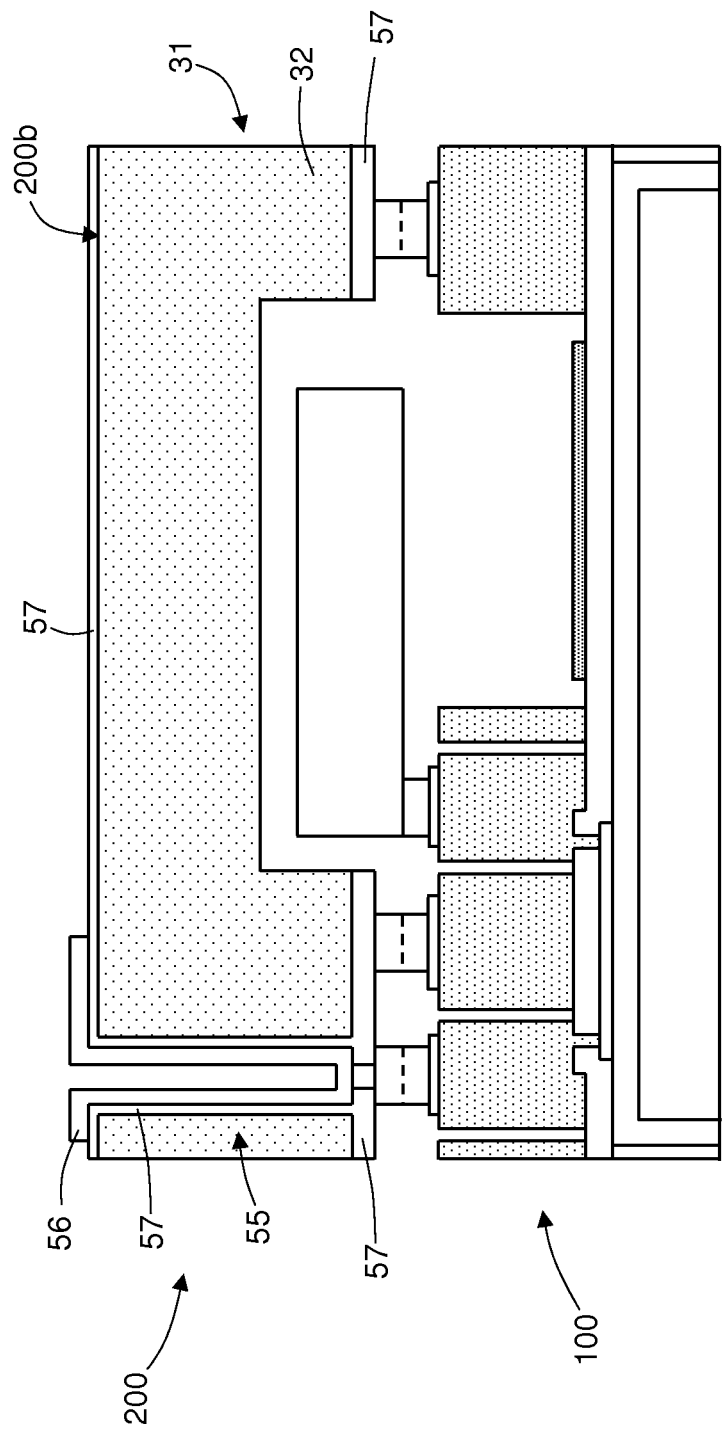
Figure 18:
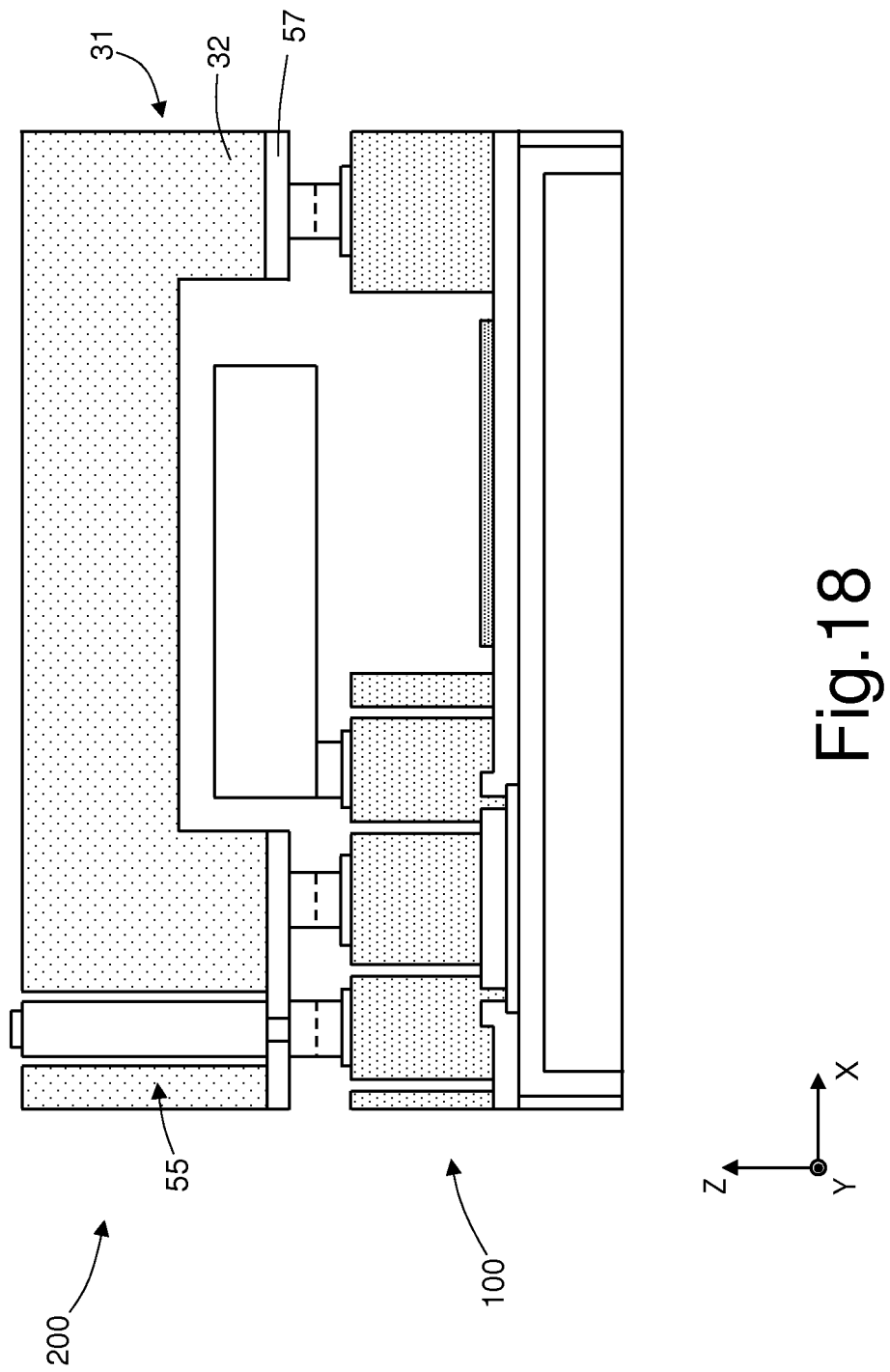

According to further embodiments, shown in FIGS. 17 and 18, the package 300 is formed as described with reference to FIGS. 1-13, but the first recess 33 of the cap 31 is not formed. Instead, the cap 31 has a conductive via 55, which extends starting from the side 200b as far as the side 200a of the wafer 200. In an area corresponding to the side 200a, in electrical contact with the conductive via 55, the cap 31 has conductive pads 58, which are designed to be coupled to the conductive pads 18 present on the wafer 100 outside the internal cavity 37.

The conductive via 55 can be a metal via (FIG. 17), having a metal layer 56 insulated from the rest of the substrate 32 of the cap 31 by means of a dielectric layer 57, or else a via formed by locally doping the substrate 32 of the cap 31 (FIG. 18), in a way similar to what has been described with reference to FIG. 15 for the substrate 1. According to the embodiments of FIGS. 17 and 18, the contact pads 18c, 18d are formed in an area corresponding to the side 200b of the cap 31.

Figure 19:
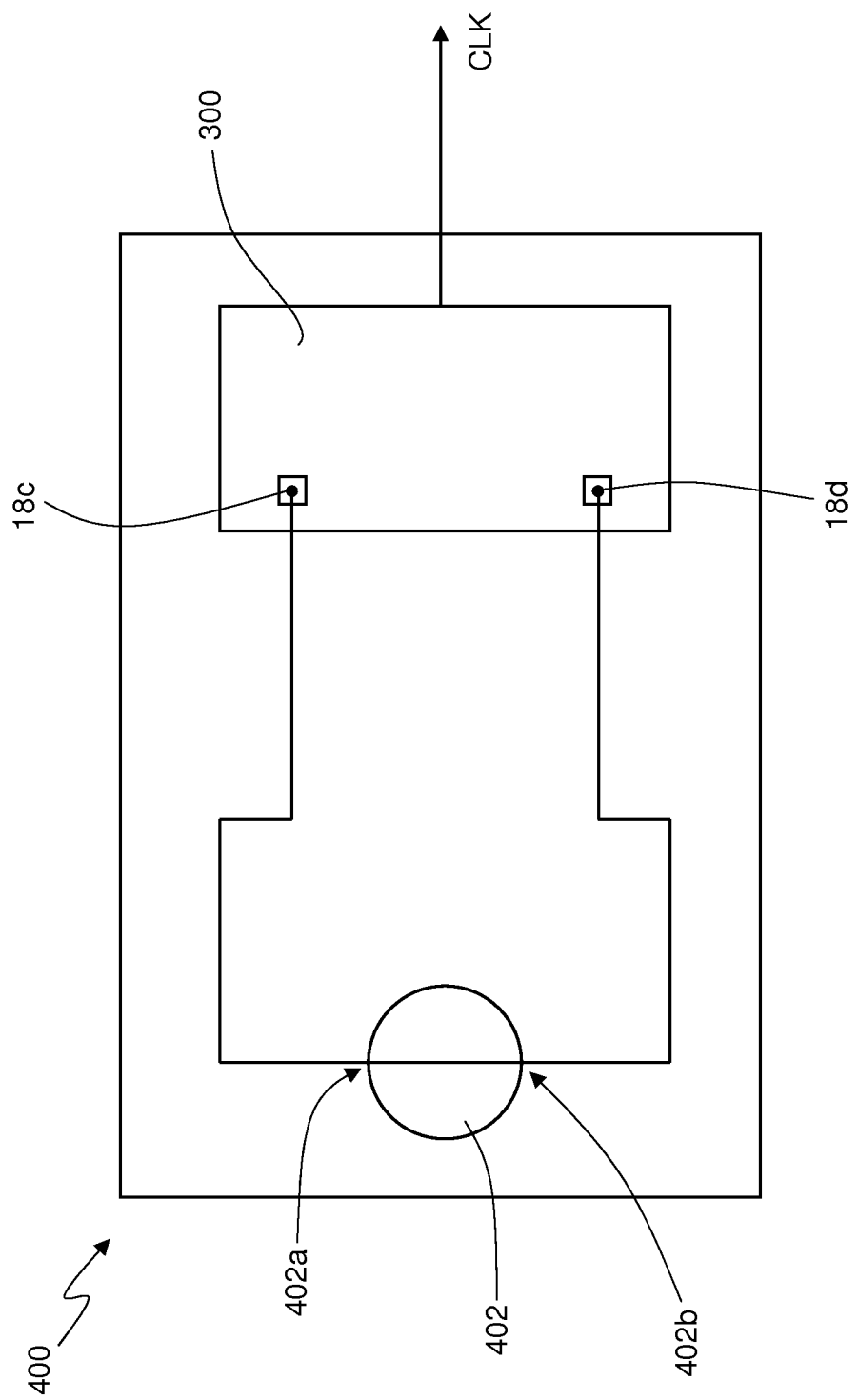
FIG. 19 shows a system comprising an oscillator device according to any one of the embodiments of the present disclosure.

FIG. 19 shows a system 400 comprising an oscillator device 300 according to any one of the embodiments of the present disclosure. The system 400 further comprises a supply circuit 402, designed to supply an electrical signal to the oscillator device 300. In particular, the supply circuit 402 is a voltage generator having a first supply terminal 400a connected to the third conductive pad 18c, and a second supply terminal 400b connected to the fourth conductive pad 18d.

The system 400 is, for example, a clock-signal generator CLK, or else a radio transmitter, or else a radio receiver, or a generic system that requires, for its own operation, a stable clock signal.

Finally, it is clear that modifications and variations may be made to what has been described and illustrated herein without thereby departing from the sphere of protection of the present disclosure.

For example, in the case where the connection between the contact pads 18a and 18b and the piezoelectric resonator 25 is obtained by means of soldering balls of dimensions greater than 30 μm, the distance between the piezoelectric resonator 25 and the structural layer 12 is such as to enable free oscillations of the piezoelectric resonator 25, and the recess 17 is not necessary.

Moreover, the coupling region 19 can comprise, as an alternative to the metal regions 14a, 15a, a region of glass material that is to form a glass-frit bonding between the cap 31 and the structural layer 12 or soldering by means of polymers.

Alternatively, the coupling region 19 comprises a biadhesive tape that is to form an adhesive bonding between the cap 31 and the structural layer 12.

In addition, the cavity 37 can house any number of piezoelectric resonators 25. Consequently, the cavity 37 can house any number of pads of a type similar to the conductive pads 18a, 18b, according to the number of piezoelectric resonators 25. Outside the cavity 37 there can thus be housed any number of pads similar to the conductive pads 18c, 18d, to bias the respective piezoelectric resonators 25.

Furthermore, the cavity 37 can house other MEMS devices (of any type, for example generic sensors), other than piezoelectric resonators. Appropriate conductive pads can then be provided inside the cavity 37 and outside it (appropriately connected together by means of buried conductive paths similar to the strips 3a and 3b) for transmitting to, and receiving from, said sensors operating signals.

From an examination of the characteristics of the disclosure obtained according to the present disclosure the advantages that it affords are evident.

In particular, use of the technology of micromachining of semiconductor components enables considerable reduction of the process costs.

Moreover, the oscillator package obtained according to the present disclosure has dimensions considerably smaller than packages of a known type, made of ceramic or metal material.

The presence of contact pads 18c, 18d external to the cavity 37 in which the resonator 25 is housed, electrically coupled to the resonator 25 by means of buried interconnections (the conductive strips 3a, 3b) enables the biasing signal to be sent easily to the resonator 25 without the need for providing through vias in the area of the cavity 37 itself. In this way, the package is more solid and less susceptible to rupture. In fact, the electrical biasing signal can be brought to the pads 18c, 18d via a wire bonding or by means of through vias formed through the substrate in a portion thereof that is thicker and hence structurally more solid than the region corresponding to the cavity 37, or again through the cap. These different options bestow on the package a high flexibility of use and application.

Moreover the presence of the recess 17 enables the contacts between the pads 18a, 18b and the resonator 25 to be made of a minimal thickness, irrespective of the amplitude of the oscillations of the resonator 25 itself or of the presence of the possible getter layer 20 (which extends inside the recess 17).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An oscillator device, comprising:
a substrate of semiconductor material, having a first side and a second side;
a structural layer extending above the first side of the substrate;

a cap of semiconductor material arranged on the structural layer;

a coupling region, extending between the structural layer and the cap, configured to hermetically seal the cap to the structural layer and form a cavity within the oscillator device;

a first conductive path and a second conductive path, which extend between the substrate and the structural layer, the first and second conductive paths each including a first terminal portion and a second terminal portion;

a first conductive pad and a second conductive pad housed in said cavity;

first and second connection regions extending through the structural layer and electrically insulated from the structural layer, the first and second connection regions respectively electrically coupling the first and second conductive pads to the respective first terminal portions of the first and second conductive paths;

a piezoelectric resonator, having a first end and a second end electrically coupled, respectively, to the first and second conductive pads, and extending in said cavity; and a third conductive pad and a fourth conductive pad positioned outside said cavity and electrically coupled respectively to the respective second terminal portions of the first and second conductive paths, wherein the structural layer is of a conductive material and the first and second connection regions are first and second conductive of the conductive material of the structural layer, the oscillator device further comprising first and second insulating trenches completely surrounding the first and second conductive pillars, respectively, and respectively insulating the first and second conductive pillars from the structural layer.

2. The oscillator device according to claim 1, wherein the structural layer has a recess inside said cavity, the piezoelectric resonator being at least partially suspended above the recess.

3. The oscillator device according to claim 2, further comprising a getter layer housed in the recess and configured for generating an ambient pressure inside the cavity different from an ambient pressure outside the cavity.

4. The oscillator device according to claim 1, further comprising a dielectric layer extending between the substrate and the first and second conductive paths.

5. The oscillator device according to claim 1, wherein the cap has a cap recess configured to house, at least partially, the piezoelectric resonator, wherein the recess of the cap extends inside said cavity.

6. The oscillator device according to claim 1, further comprising a dielectric layer extending over the first and second conductive paths, the first and second connection regions further extending through the dielectric layer.

7. The oscillator device according to claim 6, further comprising third and fourth connection regions respectively electrically coupling the third and fourth conductive pads to the second terminal portions of the first and second conductive paths, wherein the third and fourth connecting regions extend through the structural layer and the second dielectric layer and are electrically insulated from the structural layer.

8. The oscillator device according to claim 1, further comprising a first conductive through via and a second conductive through via which extend completely through said cap and are in electrical contact, respectively, with the third and fourth conductive pads.

9. The oscillator device according to claim 1, further comprising:

a first conductive through via and a second conductive through via, which extend through the substrate;

a first dielectric layer extending between the substrate and the first and second conductive paths;

a third conductive through via and a fourth conductive through via which extend through the first dielectric layer and in electrical contact, respectively, with the first and second conductive through vias; and a second dielectric layer extending over the first and second conductive paths, wherein:

the third conductive pad is formed in an area corresponding to the second side of the substrate and is coupled to the second terminal portion of the first conductive path through the first and third conductive through vias, and the fourth conductive pad is formed in an area corresponding to the second side of the substrate and is coupled to the second terminal portion of the second conductive path through the second and fourth conductive through vias.

10. The oscillator device according to claim 9, wherein said first and second conductive through vias are made of doped semiconductor material or metal material.

11. An electronic system comprising:

an oscillator device that includes:

a substrate of semiconductor material, having a first side and a second side;

a structural layer extending above the first side of the substrate;

a cap of semiconductor material arranged on the structural layer;

a coupling region, extending between the structural layer and the cap, configured to hermetically seal the cap to the structural layer and form a cavity within the oscillator device;

a first conductive path and a second conductive path, which extend between the substrate and the structural layer, the first and second conductive paths each including a first terminal portion and a second terminal portion;

a first conductive pad and a second conductive pad housed in said cavity;

first and second connection regions extending through the structural layer and electrically insulated from the structural layer, the first and second connection regions respectively electrically coupling the first and second conductive pads to the respective first terminal portions of the first and second conductive paths;

a piezoelectric resonator, having a first end and a second end electrically coupled, respectively, to the first and second conductive pads, and extending in said cavity; and a third conductive pad and a fourth conductive pad positioned outside said cavity and electrically coupled respectively to the respective second terminal portions of the first and second conductive paths; and a supply circuit having a first supply terminal electrically coupled to the third conductive pad, and a second supply terminal electrically coupled to the fourth conductive pad and configured to bias the piezoelectric resonator in such a way as to generate oscillations of the piezoelectric resonator at a stable oscillation frequency, wherein the structural layer is of a conductive material and the first and second connection regions are first and second conductive pillars, respectively, of the conductive material of the structural layer, the oscillator device further including first and second insulating trenches completely surrounding the first and second conductive pillars, respectively, and respectively insulating the first and second conductive pillars from the structural layer.

12. The system according to claim 11, wherein the structural layer has a recess inside said cavity, the piezoelectric resonator being at least partially suspended above the recess.

13. The system according to claim 12, wherein the oscillator device includes a getter layer housed in the recess and configured for generating an ambient pressure inside the cavity different from an ambient pressure outside the cavity.

14. The system according to claim 11, wherein the cap has a cap recess configured to house, at least partially, the piezoelectric resonator, wherein the recess of the cap extends inside said cavity.

15. The oscillator device according to claim 11, wherein the oscillator device includes a dielectric layer extending over the first and second conductive paths, the first and second connection regions further extending through the dielectric layer.

16. The system according to claim 15, wherein the oscillator device includes third and fourth connection regions respectively electrically coupling the third and fourth conductive pads to the second terminal portions of the first and second conductive paths, wherein the third and fourth connecting regions extend through the structural layer and the second dielectric layer and are electrically insulated from the structural layer.

17. A process for manufacturing an oscillator device, comprising:
   forming a structural layer on a first side of a substrate having the first side and a second side;
   arranging a cap of semiconductor material above the structural layer;
   forming a coupling region, between the structural layer and the cap, the coupling region being configured to hermetically seal the cap to the structural layer;
   forming a cavity within the oscillator device;
   forming a first conductive path and a second conductive path between the substrate and the structural layer, the first and second conductive paths each including a first terminal portion and a second terminal portion;
   forming a first conductive pad and a second conductive pad in said cavity;
   forming a first connection region and a second connection region through the structural layer and electrically insulated from the structural layer, so as to electrically couple the first and second conductive pads to the first terminal portion of the first and second conductive paths, respectively;
   forming, in said cavity, a piezoelectric resonator having a first end and a second end electrically coupled, respectively, to the first and second conductive pads;
   forming a third conductive pad and a fourth conductive pad outside said cavity; and
   electrically coupling the third and fourth conductive pads to the second terminal portions of the first and second conductive paths, respectively, wherein the structural layer is of a conductive material and forming the first connection region and the second connection region includes forming first and second trenches that extend completely through the structural layer, the first and second trenches respectively surrounding the first and second connection regions and respectively insulating the first and second connection regions from the structural layer.

18. The process according to claim 17, comprising electrically coupling the piezoelectric resonator is coupled to the first and second conductive pads by a flip-chip technique.

19. The process according to claim 17, further comprising forming a recess in the structural layer inside said cavity, wherein forming the piezoelectric resonator includes forming the piezoelectric resonator at least partially suspended above the recess.

20. The process according to claim 17, further comprising forming, in the recess, a getter layer configured to generate an ambient pressure inside the cavity different from an ambient pressure outside the cavity.

21. The process according to claim 17, further comprising, before forming the first and second conductive paths, forming a dielectric layer on the first side of the substrate.

22. The process according to any claim 17, further comprising forming in the cap a cap recess configured to house, at least partially, the piezoelectric resonator, wherein arranging the cap on the substrate includes arranging the cap in such a way that the cap recess extends inside said cavity.

23. The process according to claim 17, further comprising forming a dielectric layer above the first and second conductive paths, wherein forming the first and second connection regions includes removing selective portions of the dielectric layer and forming the first and second connection regions through the removed selective portions of the dielectric layer.

24. The process according to claim 23, further comprising forming trenches in the structural layer that surround the third and fourth conductive pads completely so as to form, respectively, a third conductive region and a fourth conductive region, which extend through the structural layer and are electrically insulated from the structural layer.

25. The process according to claim 17, further comprising:
   forming, in said cap, a first conductive through via and a second conductive through via; and
   forming an electrical contact between the first conductive through via and the third conductive pad, and between the second conductive through via and the fourth conductive pad.

26. The process according to claim 17, further comprising:
   forming a first conductive through via and a second conductive through via which extend through the substrate;
   forming a first dielectric layer on the first side of the substrate;
   selectively removing portions of the first dielectric layer and forming a third conductive through via and a fourth conductive through via, which extend through the first dielectric layer;
   forming an electrical contact between the third conductive through via and the first conductive through via, and between the fourth conductive through via and the second conductive through via; and
   forming a second dielectric layer above the first and second conductive paths, wherein:
   forming the third conductive pad comprises forming the third conductive pad in an area corresponding to the second side of the substrate,
   forming the fourth conductive pad comprises forming the fourth conductive pad in an area corresponding to the second side of the substrate,
   forming the first and third conductive through vias includes electrically coupling the third conductive pad to the second terminal portion of the first conductive path, and
   forming the second and fourth conductive through vias includes electrically coupling the fourth conductive pad to the second terminal portion of the second conductive path.

* * * * *